US012677539B2

(12) United States Patent
Song et al.

(10) Patent No.: US 12,677,539 B2
(45) Date of Patent: Jul. 7, 2026

(54) DISPLAY DEVICE

(71) Applicant: Samsung Display Co., LTD., Yongin-si (KR)

(72) Inventors: Hyoung Wook Song, Cheonan-si (KR); Donggyu Kang, Asan-si (KR); Sang Ho Kim, Cheonan-si (KR); Se Dong Kim, Cheonan-si (KR); So-Ra Park, Asan-si (KR); Yeon Taek Jeong, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 490 days.

(21) Appl. No.: 18/098,946

(22) Filed: Jan. 19, 2023

(65) Prior Publication Data

US 2023/0240097 A1 Jul. 27, 2023

(30) Foreign Application Priority Data

Jan. 25, 2022 (KR) ........................ 10-2022-0010683

(51) Int. Cl.
| | |
|---|---|
| H10K 59/122 | (2023.01) |
| H10K 59/35 | (2023.01) |
| H10K 59/80 | (2023.01) |

(52) U.S. Cl.
CPC ........... H10K 59/122 (2023.02); H10K 59/35 (2023.02); H10K 59/873 (2023.02)

(58) Field of Classification Search
CPC .... H10K 59/873; H10K 59/87; H10K 59/122; H10K 59/8722; H10K 59/8723; H10K 59/871; H10K 59/88; H10K 59/173; H10K 59/35; H10K 59/38; H10K 59/124; H10K 59/123; H10K 59/127; H10K 59/90; H10K 59/95; H10K 59/1213; H10K 59/121; H10K 59/353; H10K 59/12; H10K 50/846; H10K 50/84; H10K 50/844; H10K 50/8426; H10K 50/841
See application file for complete search history.

(56) References Cited

U.S. PATENT DOCUMENTS

| | | | | | |
|---|---|---|---|---|---|
| 5,278,009 | A | * | 1/1994 | Iida | G03F 7/0007 |
| | | | | | 430/7 |
| 6,636,192 | B1 | * | 10/2003 | Saitoh | G02F 1/1339 |
| | | | | | 345/87 |
| 6,740,190 | B2 | * | 5/2004 | Takase | H01L 24/14 |
| | | | | | 156/275.5 |

(Continued)

FOREIGN PATENT DOCUMENTS

| | | |
|---|---|---|
| JP | 1999-326920 | 11/1999 |
| KR | 10-0836332 | 6/2008 |

(Continued)

*Primary Examiner* — Sophia T Nguyen
(74) *Attorney, Agent, or Firm* — CANTOR COLBURN LLP

(57) ABSTRACT

A display device according to an embodiment includes a display portion, a color converting portion, and a sealant for bonding the display portion and the color converting portion. The color converting portion includes a substrate, a bank disposed on the substrate and including an opening, a color converting layer disposed in the opening of the bank, and a pattern disposed between the bank and the sealant. A thickness of the pattern is reduced toward an outside of the color converting portion.

20 Claims, 13 Drawing Sheets

(56) References Cited

U.S. PATENT DOCUMENTS

| | | | | |
|---|---|---|---|---|
| 7,081,704 B2* | 7/2006 | Yamazaki | H10K 59/38 | 313/499 |
| 7,196,465 B2* | 3/2007 | Park | H10K 71/50 | 313/506 |
| 7,365,487 B2* | 4/2008 | Matsuura | H10K 50/824 | 313/506 |
| 7,538,488 B2* | 5/2009 | Kwak | H10K 59/131 | 313/506 |
| 7,541,734 B2* | 6/2009 | Yamazaki | H10K 50/846 | 313/503 |
| 7,679,284 B2* | 3/2010 | Kubota | H10K 59/80522 | 313/506 |
| 7,990,060 B2* | 8/2011 | Ahn | H10K 59/127 | 445/25 |
| 7,990,061 B2* | 8/2011 | Kim | H10K 59/8722 | 313/503 |
| 8,125,608 B2* | 2/2012 | Kotani | G02F 1/1339 | 349/122 |
| 8,232,575 B2* | 7/2012 | Lee | H10K 50/841 | 257/99 |
| 8,415,881 B2* | 4/2013 | Satake | H10K 59/8723 | 313/512 |
| 9,076,990 B2* | 7/2015 | Nakamura | H10K 59/871 | |
| 9,312,319 B2* | 4/2016 | Lee | H10K 50/814 | |
| 9,502,683 B2* | 11/2016 | Hong | H10K 50/841 | |
| 9,570,702 B2* | 2/2017 | Hong | H10K 59/12 | |
| 9,679,919 B2* | 6/2017 | Go | H10K 59/131 | |
| 9,825,253 B2* | 11/2017 | Cho | H10K 59/131 | |
| 9,954,198 B2* | 4/2018 | Sato | H10K 59/12 | |
| 10,593,738 B2* | 3/2020 | Kim | H10K 10/84 | |
| 11,114,649 B2* | 9/2021 | Kim | H10K 59/878 | |
| 11,158,682 B2* | 10/2021 | Ahn | H10K 59/8722 | |
| 11,700,743 B2* | 7/2023 | Kim | G06F 3/0412 | 345/173 |
| 11,800,756 B2* | 10/2023 | Lim | H10K 50/84 | |
| 11,943,966 B2* | 3/2024 | Moon | H10K 50/844 | |
| 2001/0050532 A1* | 12/2001 | Eida | H05B 33/10 | 445/24 |
| 2002/0149730 A1* | 10/2002 | Jeong | G02F 1/1339 | 349/153 |
| 2002/0158568 A1* | 10/2002 | Satake | H10K 59/873 | 313/493 |
| 2004/0017526 A1* | 1/2004 | Kuo | G02F 1/136209 | 349/110 |
| 2004/0046184 A1* | 3/2004 | Yanagawa | H10K 50/844 | 257/200 |
| 2004/0242115 A1* | 12/2004 | Yanagawa | H10K 50/8426 | 257/E29.294 |
| 2005/0040762 A1* | 2/2005 | Kurihara | H10K 59/1213 | 313/504 |
| 2005/0140290 A1* | 6/2005 | Park | H10K 59/1275 | 313/506 |
| 2005/0212413 A1* | 9/2005 | Matsuura | H10K 50/846 | 313/504 |
| 2005/0243261 A1* | 11/2005 | Chiang | G02F 1/133514 | 349/155 |
| 2006/0060850 A1* | 3/2006 | Kwak | H10D 86/60 | 257/E27.111 |
| 2006/0158599 A1* | 7/2006 | Koo | G02F 1/13394 | 349/155 |
| 2007/0058125 A1* | 3/2007 | Yoo | G02F 1/1345 | 349/152 |
| 2007/0285007 A1* | 12/2007 | Lee | H10K 59/871 | 313/504 |
| 2007/0290612 A1* | 12/2007 | Hama | H10K 59/38 | 313/506 |
| 2008/0151172 A1* | 6/2008 | Kondo | G02F 1/1339 | 349/190 |
| 2009/0073357 A1* | 3/2009 | Takahashi | G02F 1/133516 | 359/891 |
| 2009/0115321 A1* | 5/2009 | Hayashi | H10K 59/873 | 313/504 |
| 2009/0256470 A1* | 10/2009 | Naono | H10K 50/824 | 313/504 |
| 2009/0303427 A1* | 12/2009 | Kondo | G02F 1/1339 | 349/190 |
| 2010/0067132 A1* | 3/2010 | Nakamura | G02F 1/1303 | 359/891 |
| 2010/0327737 A1* | 12/2010 | Hayashi | H10K 59/8722 | 313/504 |
| 2011/0037059 A1* | 2/2011 | Gyoda | H10K 59/8722 | 445/25 |
| 2011/0222013 A1* | 9/2011 | Kawanishi | G02F 1/1339 | 349/190 |
| 2012/0153309 A1* | 6/2012 | Kim | G02B 26/0841 | 438/29 |
| 2013/0009194 A1* | 1/2013 | Yamazaki | H10K 59/873 | 257/E33.059 |
| 2013/0088676 A1* | 4/2013 | Koma | G02F 1/133753 | 349/123 |
| 2014/0042408 A1* | 2/2014 | Akagawa | H10K 50/844 | 257/40 |
| 2014/0117336 A1* | 5/2014 | Kim | H10K 59/8722 | 257/40 |
| 2014/0191204 A1* | 7/2014 | Jeong | H10K 59/8792 | 257/40 |
| 2014/0232971 A1* | 8/2014 | Kubota | G02F 1/13439 | 349/110 |
| 2014/0312339 A1* | 10/2014 | Fujita | H10K 59/35 | 257/40 |
| 2015/0001576 A1* | 1/2015 | Iwata | H10K 59/8722 | 438/26 |
| 2015/0028307 A1* | 1/2015 | Kim | H10K 50/8426 | 257/40 |
| 2015/0060806 A1* | 3/2015 | Park | H10K 50/8428 | 257/40 |
| 2015/0185942 A1* | 7/2015 | Kim | H10K 59/40 | 345/173 |
| 2015/0236297 A1* | 8/2015 | Hong | H10K 59/8722 | 257/40 |
| 2015/0340655 A1* | 11/2015 | Lee | H10K 59/874 | 257/40 |
| 2015/0380685 A1* | 12/2015 | Lee | H10K 59/122 | 257/40 |
| 2016/0079324 A1* | 3/2016 | Go | H10K 50/8428 | 257/88 |
| 2016/0086977 A1* | 3/2016 | Go | H10D 86/441 | 257/773 |
| 2016/0301031 A1* | 10/2016 | Mimura | H10K 50/824 | |
| 2017/0045782 A1* | 2/2017 | Cho | G02F 1/1339 | |
| 2017/0125727 A1* | 5/2017 | Sato | H10K 50/865 | |
| 2017/0133627 A1* | 5/2017 | Sato | G06F 3/0412 | |
| 2017/0170247 A1* | 6/2017 | Kim | H10K 71/00 | |
| 2018/0181240 A1* | 6/2018 | Heo | G06F 3/0412 | |
| 2018/0331160 A1* | 11/2018 | Beak | G06F 3/0446 | |
| 2018/0366520 A1* | 12/2018 | Gwon | H10K 50/828 | |
| 2019/0051857 A1* | 2/2019 | Xu | H10K 71/00 | |
| 2019/0131572 A1* | 5/2019 | Gwon | H10K 59/8731 | |
| 2019/0137815 A1* | 5/2019 | Kim | H10K 50/171 | |
| 2019/0180682 A1* | 6/2019 | Kim | H10K 50/15 | |
| 2019/0198802 A1* | 6/2019 | Lee | H10K 50/8426 | |
| 2019/0206960 A1* | 7/2019 | Lee | H10K 50/171 | |
| 2019/0305072 A1* | 10/2019 | Park | H10K 50/81 | |
| 2019/0326361 A1* | 10/2019 | Gwon | H10K 77/111 | |
| 2019/0334115 A1* | 10/2019 | Matsuda | H10K 59/873 | |
| 2019/0348476 A1* | 11/2019 | Kato | G09F 9/30 | |
| 2020/0152704 A1* | 5/2020 | Jang | H10K 59/126 | |
| 2020/0152705 A1* | 5/2020 | Son | H10K 59/38 | |
| 2020/0212115 A1* | 7/2020 | Choi | H10K 50/86 | |
| 2020/0274089 A1* | 8/2020 | Son | H10K 59/87 | |
| 2020/0295310 A1* | 9/2020 | Moon | H10K 59/38 | |
| 2020/0303475 A1* | 9/2020 | Go | H10K 50/8428 | |
| 2020/0321292 A1* | 10/2020 | Park | H10D 89/931 | |
| 2021/0028236 A1* | 1/2021 | Kim | H10K 59/877 | |
| 2021/0200363 A1* | 7/2021 | Lee | G06F 3/0445 | |
| 2021/0217835 A1* | 7/2021 | Park | H10K 50/844 | |
| 2021/0320150 A1* | 10/2021 | Yang | H10K 59/871 | |
| 2021/0376291 A1* | 12/2021 | Park | H10K 50/844 | |
| 2021/0384283 A1* | 12/2021 | Jung | H10K 59/131 | |

(56)          References Cited

U.S. PATENT DOCUMENTS

| | | | | |
|---|---|---|---|---|
| 2021/0384461 A1* | 12/2021 | Kim | ........................ | H10K 59/40 |
| 2022/0157893 A1* | 5/2022 | Baek | .................... | H10K 50/858 |
| 2022/0165816 A1* | 5/2022 | Son | ...................... | H10K 59/122 |
| 2022/0199939 A1* | 6/2022 | Gao | ...................... | H10K 59/126 |
| 2022/0206620 A1* | 6/2022 | Lee | ....................... | H10K 59/40 |
| 2022/0209176 A1* | 6/2022 | Cha | .................... | H10K 50/8426 |
| 2023/0209977 A1* | 6/2023 | Sung | ................. | H10K 50/8428 |
| | | | | 345/173 |
| 2023/0240097 A1* | 7/2023 | Song | ..................... | H10K 59/35 |
| 2024/0373728 A1* | 11/2024 | Shimatsu | .............. | H10K 59/38 |
| 2024/0381732 A1* | 11/2024 | Kim | .................. | H10K 59/8722 |
| 2025/0221256 A1* | 7/2025 | Kim | ...................... | H10K 59/38 |

FOREIGN PATENT DOCUMENTS

| | | |
|---|---|---|
| KR | 10-0864882 | 10/2008 |
| KR | 10-1289064 | 8/2013 |

* cited by examiner

Figure 3:
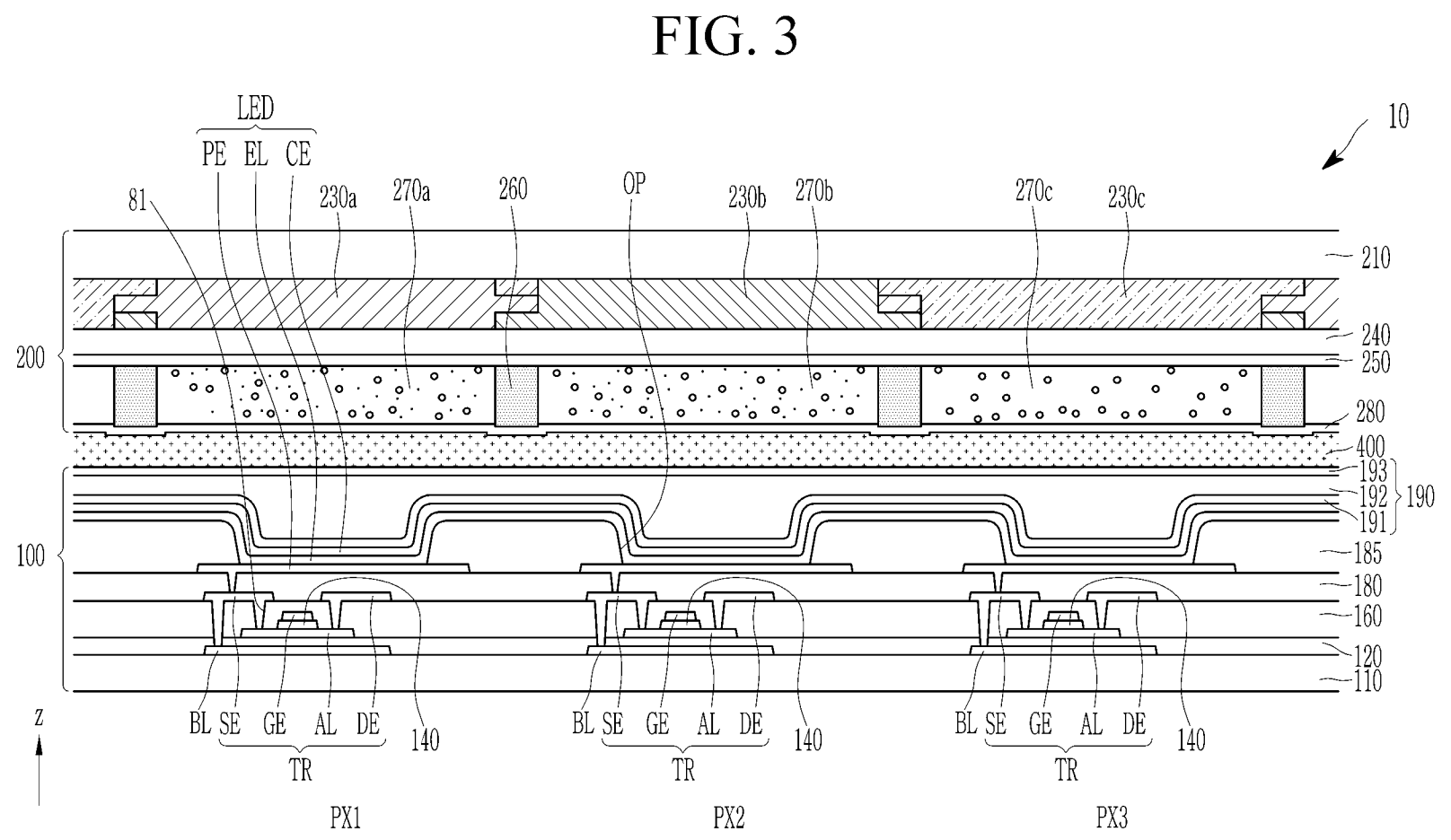

LED { PE EL CE }

81
230a
270a
260
OP
230b
270b
230c
270c
240

200
100

PX1    PX2    PX3

TR { BL SE GE AL DE }    140 z

DISPLAY DEVICE

CROSS-REFERENCE TO RELATED APPLICATION(S)

This application claims priority to and benefits of Korean Patent Application No. 10-2022-0010683 under 35 U.S.C. § 119, filed in the Korean Intellectual Property Office on Jan. 25, 2022, the entire contents of which are incorporated herein by reference.

BACKGROUND

1. Technical Field

This disclosure relates to a light emitting display device including a color converting unit (color converting portion).

2. Description of the Related Art

As display devices, light emitting display devices for displaying images by adjusting luminance of light-emitting devices and liquid crystal displays for displaying images by adjusting transmittance of liquid crystal layers are in widespread use. The light emitting display device requires no additional light source such as a backlight, differing from the liquid crystal display, so a thickness and a weight of the display device may be reduced. Further, the light emitting diode displays have high-quality characteristics such as low power consumption, high luminance, and high reaction rates.

Recently, to realize display devices that have reduced light losses and high color reproducibility, a display device has been proposed that includes a color converting unit. The color converting unit may include color converting layers in which quantum dots may be dispersed, and may convert incident light into light of different colors.

The color converting unit may be bonded to the display unit on which light-emitting devices may be disposed by a sealant. In case that the color converting unit is bonded to the display unit, the color converting unit or the display unit may be locally drooped because of differences of supporting heights for respective regions. In case that it is drooped, there may be a luminance difference among regions of the display device, and hence, defects such as light leakage or stains may be generated.

The above information disclosed in this Background section is only for enhancement of understanding of the related art, and therefore it may contain information that does not form art that is already known in this country to a person of ordinary skill in the art.

SUMMARY

Embodiments provide a display device for preventing or improving drooping of a color converting unit (color converting portion) or a display unit (display portion).

An embodiment provides a display device that may include a display portion, a color converting portion, and a sealant bonding the display portion and the color converting portion. The color converting portion may include a substrate, a bank disposed on the substrate and including an opening, a color converting layer disposed in the opening of the bank, and a pattern disposed between the bank and the sealant. A thickness of the pattern may be reduced toward an outside of the color converting portion.

The color converting portion may further include a dummy bank disposed between the bank and the pattern, and the pattern may be physically connected to the dummy bank.

The pattern and the dummy bank may be integral with each other.

The pattern, the dummy bank, and the bank may include a same material.

The color converting portion may include a display area for displaying images and a non-display area surrounding the display area, the bank may be disposed in the display area, and the pattern, the dummy bank, and the sealant may be disposed in the non-display area.

The color converting portion may further include a color filter disposed on the substrate, a first capping layer disposed on the color filter, and a second capping layer disposed on the color converting layer. The bank and the pattern may be disposed between the first capping layer and the second capping layer.

Each of the bank and the pattern may include a first side contacting the first capping layer and a second side contacting the second capping layer.

The display device may further include a filler disposed between the display portion and the color converting portion, wherein the filler may cover at least a portion of the pattern.

The display portion may include a substrate, a light emitting diode disposed on the substrate, and an encapsulation layer disposed on the light emitting diode. The filler may contact the encapsulation layer.

The display portion may include a display area for displaying images, and a non-display area surrounding the display area. The display portion may further include a dam disposed in the non-display area and surrounding the display area, and a mask support disposed in the non-display area and spaced from the dam. The filler may overlap the mask support.

The color converting layer may include quantum dots and may overlap the light emitting diode.

The thickness of the pattern may be reduced in a staircase structure toward the outside of the color converting portion.

A slope for the thickness of the pattern to be reduced may be constant, may be gradually increased, or may be gradually reduced toward the outside of the color converting portion.

The pattern may include a portion overlapping the sealant.

An embodiment provides a display device that may include a display portion in which light emitting diodes may be disposed on a first substrate, a color converting portion overlapping the display portion, in which color converting layers including quantum dots may be disposed on a second substrate, and a sealant bonding the display portion and the color converting portion. The display portion and the color converting portion include a display area for displaying images and a non-display area adjacent to the display area. The color converting portion may include a bank disposed in the display area and partitioning the color converting layers, a dummy bank disposed in the non-display area and including a same material as the bank, and a pattern disposed between the dummy bank and the sealant in the non-display area, and including a same material as the bank, and a thickness of a first portion of the pattern adjacent to the sealant may be less than a thickness of a second portion of the pattern adjacent to the dummy bank.

The thickness of the pattern may be gradually reduced toward the first portion from the first portion.

The pattern and the dummy bank may be integral with each other.

The color converting portion may further include a color filter disposed on the second substrate, a first capping layer disposed on the color filter, and a second capping layer disposed on the color converting layers. The bank, the dummy bank, and the pattern may be disposed between the first capping layer and the second capping layer.

The display device may further include a filler disposed between the display portion and the color converting portion. The filler may cover the bank, the dummy bank, and at least a portion of the pattern.

The display portion may further include an encapsulation layer disposed on the light emitting diodes and including an inorganic layer and an organic layer. The filler may contact the encapsulation layer.

According to embodiments, a display device may be provided for preventing or improving the drooping of the color converting unit or the display unit without giving an influence to process limiting conditions. According to the embodiments, advantageous effects that may be recognized throughout the disclosure are provided.

BRIEF DESCRIPTION OF THE DRAWINGS

FIG. 3 shows a schematic cross-sectional view of a display area on a display panel according to an embodiment.

DETAILED DESCRIPTION OF THE EMBODIMENTS

Figure 1:
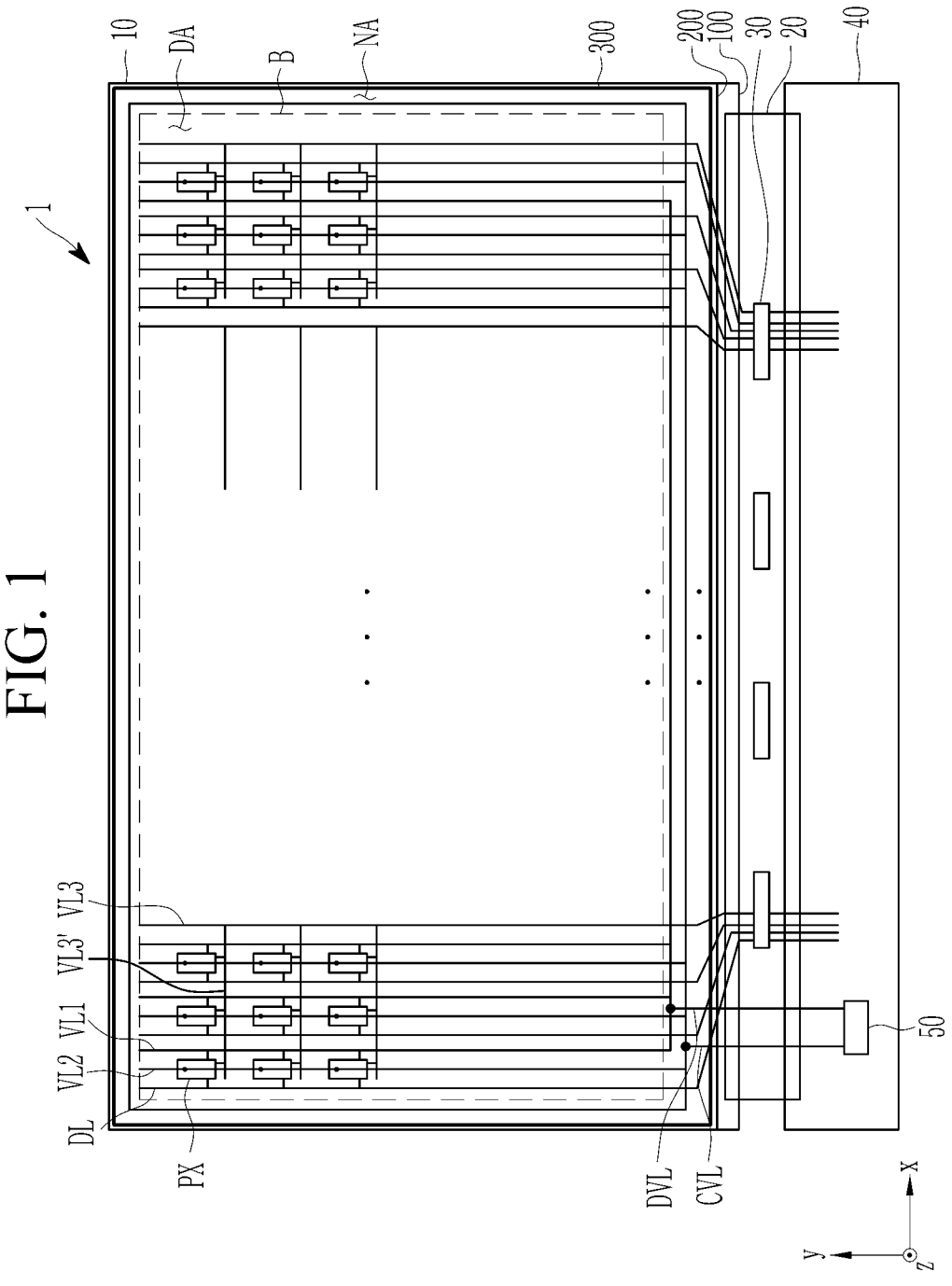
FIG. 1 shows a schematic plan view of a display device according to an embodiment.

This disclosure will be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

It will be understood that when an element such as a layer, film, region, or substrate is referred to as being "on" another element, it can be directly on the other element or intervening elements may also be present. In contrast, when an element is referred to as being "directly on" another element, there may be no intervening elements present.

The terms "comprises," "comprising," "includes," and/or "including,", "has," "have," and/or "having," and variations thereof when used in this disclosure, specify the presence of stated features, integers, steps, operations, elements, components, and/or groups thereof, but do not preclude the presence or addition of one or more other features, integers, steps, operations, elements, components, and/or groups thereof.

It will be understood that when an element (or a region, a layer, a portion, or the like) is referred to as "being on", "connected to" or "coupled to" another element in the disclosure, it can be directly disposed on, connected or coupled to another element mentioned above, or intervening elements may be disposed therebetween.

It will be understood that the terms "connected to" or "coupled to" may include a physical or electrical connection or coupling.

Terms "x", "y", and "z" are used, and here, "x" may be a first direction, "y" may be a second direction that is perpendicular to the first direction, and "z" may be a third direction that may be perpendicular to the first direction and the second direction. A first direction x, a second direction y, and a third direction z may respectively correspond to a horizontal direction, a vertical direction, and a thickness direction of the display device.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

"About", "approximately", and "substantially" as used herein are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 shows a schematic plan view of a display device according to an embodiment.

Referring to FIG. 1, the display device 1 may include a display panel 10, a flexible printed circuit film 20, a driving integrated circuit chip 30, a printed circuit board (PCB) 40, and a power module 50.

The display panel 10 may include a display area DA that corresponds to an image displaying screen, and a non-display area NA in which circuits and/or wires for generating and/or transmitting various signals applied to the display area DA may be disposed. The non-display area NA may be disposed near the display area DA, and may surround the display area DA. An internal region and an external region of a border line B shown in FIG. 1 may respectively be the display area DA and the non-display area NA.

The display panel 10 may include a display unit (display portion) 100 and a color converting unit (color converting portion) 200. The display unit 100 may be bonded to the color converting unit 200 by a sealant 300 surrounding an edge of the display panel 10 between the display unit 100 and the color converting unit 200. The color converting unit 200 may generally overlap the display unit 100, and the display unit 100 may include a region that may not be covered by the color converting unit 200 for the purpose of connecting or bonding the flexible printed circuit film 20. The display unit 100 may include a pad portion (not shown) for connecting or bonding the flexible printed circuit film 20, and the color converting unit 200 may be formed to be shorter than the display unit 100 in a region in which the pad portion may be positioned, for example, at a lower portion of the display panel 10, so that the pad portion may be exposed to an outside. The display unit 100 and the color converting unit 200 may respectively include regions that correspond to the display area DA and the non-display area NA of the display panel 10.

Pixels PX may be disposed in a matrix form in the display area DA of the display panel 10. A data line DL for transmitting a data voltage $V_{DATA}$, a driving voltage line VL1 for transmitting a driving voltage $EL_{VDD}$, a common voltage line VL2 for transmitting a common voltage $EL_{VSS}$, and an initialization voltage line VL3 for transmitting an initialization voltage $V_{INT}$ may be positioned in the display area DA. The driving voltage line VL1, the common voltage line VL2, and the initialization voltage line VL3 may extend in the second direction y. The initialization voltage line VL3 may include a branch voltage line VL3' extending in the first direction x. The respective pixels PX may receive the data voltage $V_{DATA}$, the driving voltage $EL_{VDD}$, the common voltage $EL_{VSS}$, and the initialization voltage $V_{INT}$ from the wires. The driving voltage $EL_{VDD}$ and the common voltage $EL_{VSS}$ may represent power voltages applied to the respective pixels PX, and the driving voltage line VL1 and the common voltage line VL2 for transmitting the power voltages may be referred to as power voltage lines. The driving voltage $EL_{VDD}$ may have a higher value than the common voltage $EL_{VSS}$. The driving voltage $EL_{VDD}$ may be referred to as a first power voltage or a high-potential power voltage. The common voltage $EL_{VSS}$ may be referred to as a second power voltage or a low-potential power voltage.

Gate drivers (not shown) may be positioned in the non-display area NA of the display panel 10. The gate drivers may be integrated to the non-display area NA. The pixels PX may receive a gate signal (also referred to as a scan signal) generated by the gate driver and may receive a data voltage $V_{DATA}$ at a timing.

A driving voltage transmitting line DVL connected to the driving voltage lines VL1 and a common voltage transmitting line CVL connected to the common voltage lines VL2 may be positioned in the non-display area NA of the display panel 10. The driving voltage transmitting line DVL and the common voltage transmitting line CVL may respectively include portions substantially extending in the second direction y and portions substantially extending in the first direction x. The common voltage transmitting line CVL may surround the display area DA. The common voltage lines VL2 may be connected to the common voltage transmitting line CVL on a lower side and an upper side of the display area DA, and may uniformly supply the common voltage $EL_{VSS}$ in the display area DA throughout.

The flexible printed circuit film 20 may include a first end connected or bonded to the display unit 100 of the display panel 10 and a second end connected or bonded to the printed circuit board (PCB) 40. A driving integrated circuit chip 30 including a data driver for applying a data voltage $V_{DATA}$ to the data line DL may be positioned on the flexible printed circuit film 20.

A power module 50 for generating a power voltage such as the driving voltage $EL_{VDD}$ or the common voltage $EL_{VSS}$ may be positioned on the printed circuit board (PCB) 40. The power module 50 may be provided as an integrated circuit chip. A signal controller (not shown) for controlling the data driver and the gate driver may be positioned on the printed circuit board (PCB) 40.

Figure 2:
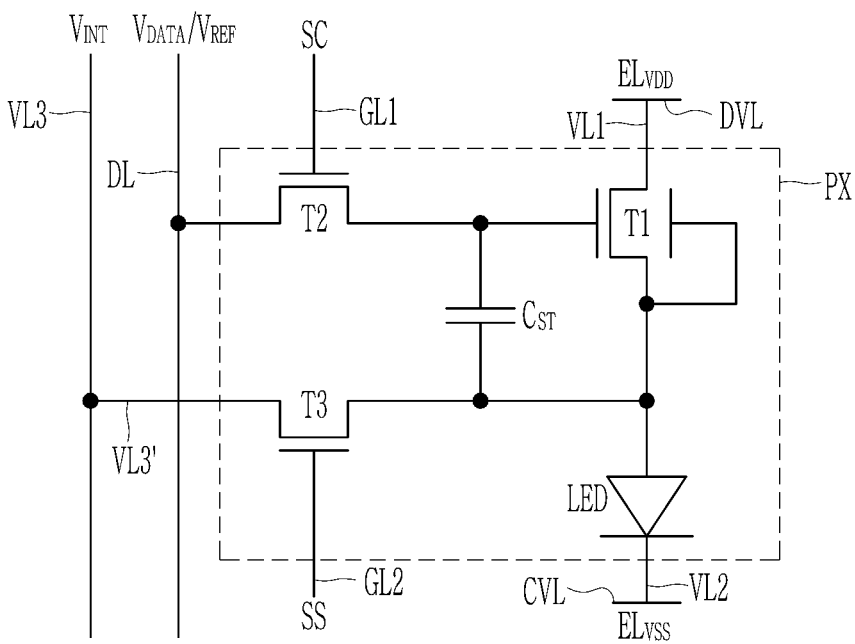
FIG. 2 shows a circuit diagram of a pixel of a display device according to an embodiment.

FIG. 2 shows a circuit diagram of a pixel of a display device according to an embodiment.

Referring to FIG. 2, the pixel PX may include first to third transistors T1 to T3, a storage capacitor $C_{ST}$, and a light emitting diode LED. The light emitting diode LED may be an organic or inorganic light emitting diode. The first to third transistors T1 to T3 may be n-type transistors, and at least some thereof may be p-type transistors.

A gate electrode of the first transistor T1 may be connected to a first electrode of the storage capacitor $C_{ST}$. A first electrode of the first transistor T1 may be connected to the driving voltage line VL1 for transmitting the driving voltage $EL_{VDD}$, and a second electrode of the first transistor T1 may be connected to an anode of the light emitting diode LED and a second electrode of the storage capacitor $C_{ST}$. The first transistor T1 may receive the data voltage $V_{DATA}$ according to a switching operation of the second transistor T2 and may supply a driving current to the light emitting diode LED according to a voltage charged in the storage capacitor $C_{ST}$.

A gate electrode of the second transistor T2 may be connected to a first gate line GL1 for transmitting a first scan signal SC. A first electrode of the second transistor T2 may be connected to the data line DL for transmitting the data voltage $V_{DATA}$ or a reference voltage $V_{REF}$. A second electrode of the second transistor T2 may be connected to the first electrode of the storage capacitor $C_{ST}$ and the gate electrode of the first transistor T1. The second transistor T2 may be turned on according to the first scan signal SC and may transmit the reference voltage $V_{REF}$ or the data voltage $V_{DATA}$ to the gate electrode of the first transistor T1.

The gate electrode of the third transistor T3 may be connected to the second gate line GL2 for transmitting a second scan signal SS. A first electrode of the third transistor T3 may be connected to the initialization voltage line VL3 for transmitting the initialization voltage $V_{INT}$. A second electrode of the third transistor T3 may be connected to the second electrode of the storage capacitor $C_{ST}$, and the second electrode of the first transistor T1 and the anode. The third transistor T3 may be turned on according to the second scan signal SS and may transmit the initialization voltage $V_{INT}$ to the anode to initialize the voltage at the anode.

The first electrode of the storage capacitor $C_{ST}$ may be connected to the gate electrode of the first transistor T1, and the second electrode of the storage capacitor $C_{ST}$ may be connected to the second electrode of the third transistor T3 and the anode. A cathode of the light emitting diode LED may be connected to the common voltage line VL2 for transmitting the common voltage $EL_{VSS}$. Each light emitting diode LED may configure a pixel PX, and the anode and the cathode of the light emitting diode LED may be referred to as the pixel electrode and the common electrode respectively.

The light emitting diode LED may emit light of luminance (grays) according to the driving current generated by the first transistor T1.

An operation of a circuit shown in FIG. 2, particularly, an operation thereof for a frame, will now be described by using a case in which the transistors T1 to T3 may be n-type transistors as an example.

In case that a frame starts, the common voltage $EL_{VSS}$ may be applied as a high-level voltage while the first scan signal SC and the second scan signal SS have a low level for an initialization section. By this, the current may be prevented from flowing through the light emitting diode LED, and the light emitting diode LED may be accordingly prevented from emitting light. The initialization voltage $V_{INT}$ may be applied through the initialization voltage line VL3 so that the initialization voltage line VL3 may be initialized. The high-level first scan signal SC and the high-level second scan signal SS may be supplied so that the second transistor T2 and the third transistor T3 may be turned on. The reference voltage $V_{REF}$ from the data line DL may be supplied to the gate electrode of the first transistor T1 and the first electrode of the storage capacitor $C_{ST}$ through the turned-on second transistor T2, and the initialization voltage $V_{INT}$ may be supplied to the second electrode of the first transistor T1 and the anode through the turned-on third transistor T3. Therefore, for the initialization section, the anode may be initialized with the initialization voltage $V_{INT}$. A voltage difference $V_{REF}$–$V_{INT}$ between the reference voltage $V_{REF}$ and the initialization voltage $V_{INT}$ may be stored in the storage capacitor $C_{ST}$.

For a sensing section, the high-level first scan signal SC and the high-level second scan signal SS may be maintained. The initialization voltage line VL3 may be disconnected from a source of the initialization voltage $V_{INT}$, and may function as a sensing line. The gate electrode of the first transistor T1 and the first electrode of the storage capacitor $C_{ST}$ may maintain the reference voltage $V_{REF}$ through the second transistor T2. In case that the voltage at the second electrode becomes "reference voltage $V_{REF}$-threshold voltage $V_{TH}$" while the current flows to the second electrode of the first transistor T1 from the first electrode thereof, the first transistor T1 may be turned off, and the initialization voltage line VL3 may be charged up to "reference voltage $V_{REF}$-threshold voltage $V_{TH}$". Here, the threshold voltage $V_{TH}$ may represent the threshold voltage $V_{TH}$ of the first transistor T1. The initialization voltage line VL3 charged with "reference voltage $V_{REF}$-threshold voltage $V_{TH}$" may be connected to an external circuit, and the external circuit may sense the voltage of the initialization voltage line VL3 and may extract the threshold voltage $V_{TH}$ of the first transistor T1. By reflecting characteristic information sensed and generating a compensated data signal for the sensing section, characteristic deviations of the first transistor T1 that may be different for the respective pixels PX may be compensated.

For a data input section, a high-level first scan signal SC may be supplied, a low-level second scan signal SS may be supplied, and the data voltage $V_{DATA}$ from the data line DL may be supplied to the gate electrode of the first transistor T1 and the first electrode of the storage capacitor $C_{ST}$ through the turned-on second transistor T2. The data voltage $V_{DATA}$ may have a compensated value based on the sensing of the threshold voltage $V_{TH}$ of the first transistor T1, and by this, the characteristic deviation of the first transistor T1 may be corrected. In case that the data voltage $V_{DATA}$ is applied, the second electrode of the first transistor T1 and the anode may substantially maintain the potential for the sensing section by the turned-off first transistor T1.

For a light emitting section, the first transistor T1 turned on by the data voltage $V_{DATA}$ transmitted to the gate electrode of the first transistor T1 may generate a driving current caused by the data voltage $V_{DATA}$, and the light emitting diode LED may emit light by the driving current. For example, luminance of the light emitting diode LED may be controlled by controlling the driving current applied to the light emitting diode LED according to the size of the data voltage $V_{DATA}$ applied to the pixel PX.

Figure 4:
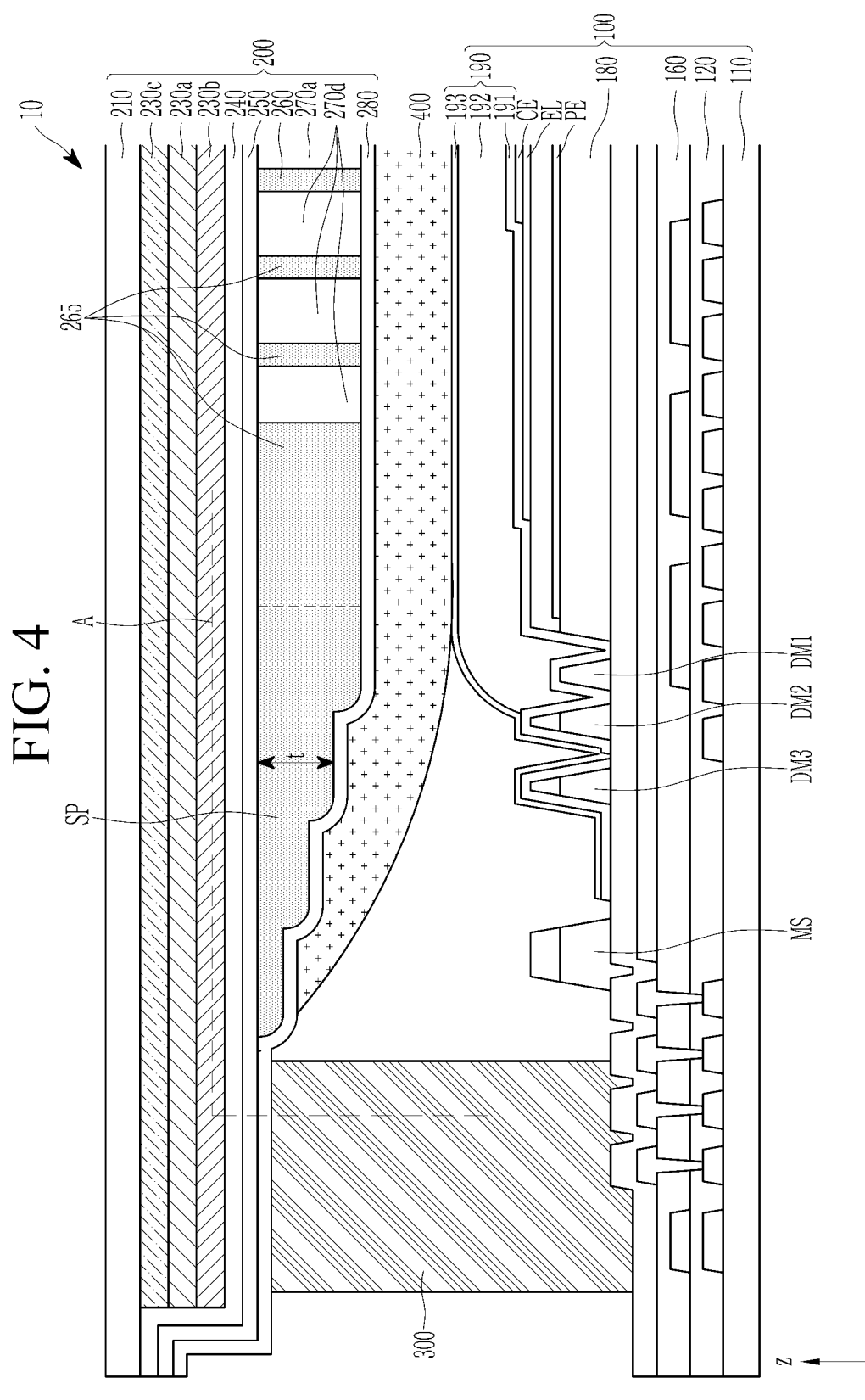
FIG. 4 shows a schematic cross-sectional view of a non-display area on a display panel according to an embodiment.
Figure 5:
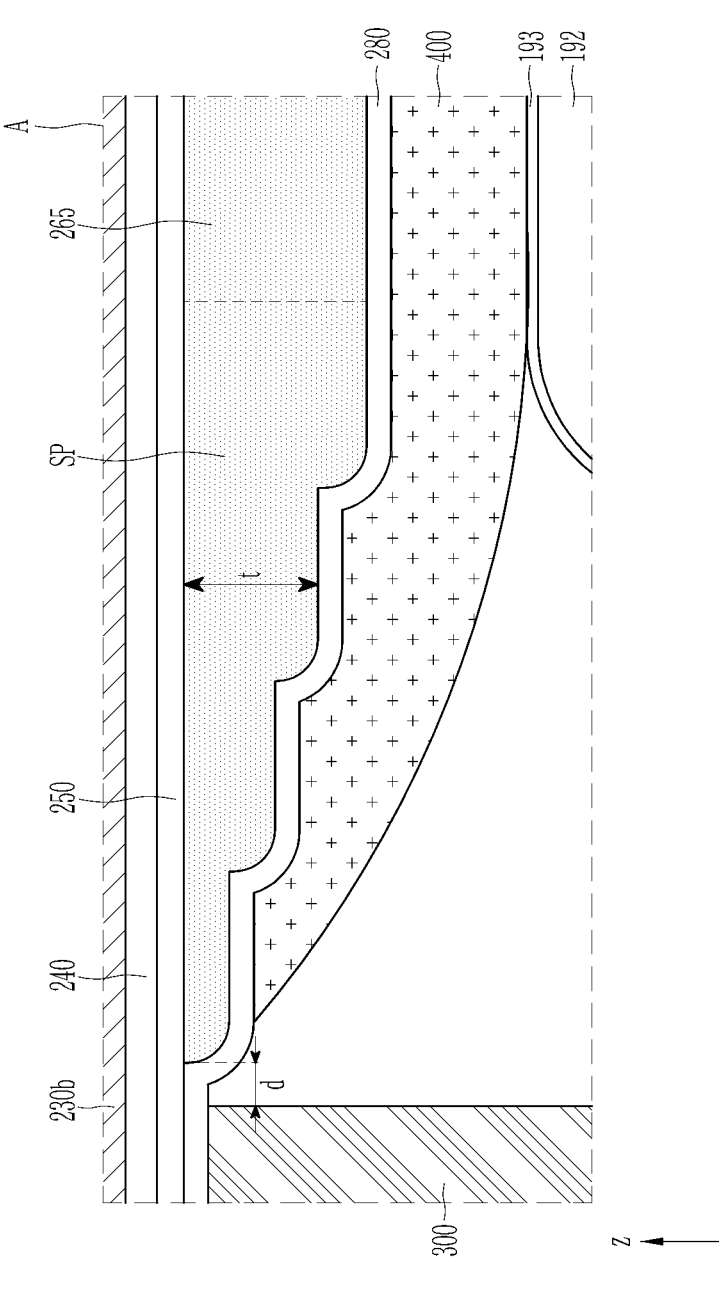
FIG. 5 shows an enlarged view of a region A of FIG. 4.

FIG. 3 shows a schematic cross-sectional view of a display area on a display panel according to an embodiment, FIG. 4 shows a schematic cross-sectional view of a non-display area on a display panel according to an embodiment, and FIG. 5 shows an enlarged view of a region A of FIG. 4.

Referring to FIG. 3 and FIG. 4, the display panel 10 may include a display unit 100, a color converting unit 200, a sealant 300 for bonding the display unit 100 and the color converting unit 200, and a filler 400 positioned between the display unit 100 and the color converting unit 200. The color converting unit 200 may overlap the display unit 100. The sealant 300 may be positioned along facing edges of the display unit 100 and the color converting unit 200 in the non-display area NA. The filler 400 may be positioned in the entire display area DA, and may be positioned in at least part of the non-display area NA.

The pixels PX1, PX2, and PX3 may be repeatedly disposed in the display area DA, and the display unit 100 may include light emitting diodes LED corresponding to the respective pixels PX1, PX2, and PX3. The color converting unit 200 may convert a wavelength of light emitted by the light emitting diode LED into another one and may output the same to an outside of the display panel 10. The pixels PX1, PX2, and PX3 may, for example, include a first pixel PX1 for emitting red light, a second pixel PX2 for emitting green light, and a third pixel PX3 for emitting blue light.

The display unit 100 may basically include a substrate 110, a transistor TR formed on the substrate 110, and a light emitting diode LED connected to the transistor TR.

The substrate 110 may include a material with a rigid characteristic such as glass or a material with a flexible characteristic such as plastic. For example, the substrate 110 may be a glass substrate.

A light blocking layer BL may be positioned on the substrate 110. The light blocking layer BL may prevent external light from reaching a semiconductor layer AL of the transistor TR and may prevent deterioration of the characteristic of the semiconductor layer AL. A leakage current of the transistor TR, particularly the driving transistor having an important current characteristic in the light emitting display device, may be controlled by the light blocking layer BL. The light blocking layer BL may include a material that may not transmit light with a wavelength to be blocked. For example, the light blocking layer BL may include a metal such as copper (Cu), aluminum (Al), molybdenum (Mo), titanium (Ti), tungsten (W), or a combination thereof, and may be a single layer or a multilayer. For example, the light blocking layer BL may have a double-layer structure such as titanium (Ti)/copper (Cu). The light blocking layer BL may function as an electrode for receiving a specific voltage from the display panel 10. A current change rate may be reduced in a saturation region in a voltage-current characteristic graph of the transistor TR, thereby improving the characteristic as a driving transistor.

A buffer layer 120 may be positioned on the substrate 110 and the light blocking layer BL. The buffer layer 120 may improve the characteristic of the semiconductor layer AL by blocking impurities from the substrate 110 in case that the semiconductor layer AL is formed, and may release the stress of the semiconductor layer AL by planarizing the surface of the substrate 110. The buffer layer 120 may include an inorganic insulating material such as a silicon nitride (SiN$_x$), a silicon oxide (SiO$_x$), and/or a silicon oxynitride (SiO$_x$N$_y$). The buffer layer 120 may include amorphous silicon.

A semiconductor layer AL may be positioned on the buffer layer 120. The semiconductor layer AL may include a first region, a second region, and a channel region between the two regions. The semiconductor layer AL may include an oxide semiconductor. For example, the semiconductor layer AL may include an oxide semiconductor, such as an indium-gallium-zinc oxide (IGZO), including at least one of zinc (Zn), indium (In), gallium (Ga), and tin (Sn). The semiconductor layer AL may include polycrystalline silicon or amorphous silicon, for example, low temperature polysilicon (LTPS).

A gate insulating layer 140 may be positioned on the semiconductor layer AL. The gate insulating layer 140 may be formed in a region overlapping the gate electrode GE. The above-noted structure may be formed by etching the gate insulating layer 140 in a photolithography process for forming a gate electrode GE. Differing from this, the gate insulating layer 140 may substantially cover the entire substrate 110. The gate insulating layer 140 may include an inorganic insulating material such as a silicon oxide, a silicon nitride, and/or a silicon oxynitride, and may be a single layer or a multilayer.

A gate electrode GE may be positioned on the gate insulating layer 140. The gate electrode GE may overlap the channel region of the semiconductor layer AL. The gate electrode GE may include a metal such as molybdenum (Mo), aluminum (Al), copper (Cu), titanium (Ti), or a combination thereof, and may be a single layer or a multi-layer. For example, the gate electrode GE may have a double-layer structure such as titanium (Ti)/copper (Cu). The above-described first gate line GL1 and/or the second gate line GL2 may be at the same layer as the gate electrode GE. In this disclosure, the same layer or forming the same layer may mean that the constituent elements may be formed of the same material in the same process (e.g., the same photolithography process).

An inter-layer insulating layer 160 may be positioned on the gate electrode GE. The inter-layer insulating layer 160 may include an inorganic insulating material such as a silicon oxide, a silicon nitride, or a silicon oxynitride, and may be a single layer or a multilayer.

A first electrode SE and a second electrode DE of the transistor TR may be positioned on the inter-layer insulating layer 160. One of the first electrode SE and the second electrode DE may be a source electrode of the transistor TR, and the other thereof may be a drain electrode of the transistor TR. The first electrode SE and the second electrode DE may be respectively connected to the first region and the second region of the semiconductor layer AL through contact holes 81 formed in the inter-layer insulating layer 160. The first electrode SE or the second electrode DE may be connected to the light blocking layer BL through the contact holes formed in the inter-layer insulating layer 160 and the buffer layer 120. The first electrode SE and the second electrode DE may include metals such as aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), or a combination thereof, and may be a single layer or a multilayer. For example, the first electrode SE and the second electrode DE may have a double-layered structure such as titanium (Ti)/copper (Cu) or a triple-layered structure such as titanium (Ti)/aluminum (Al)/titanium (Ti).

The above-noted data line DL, the driving voltage line VL1, the common voltage line VL2, the initialization voltage line VL3, the driving voltage transmitting line DVL, and/or the common voltage transmitting line CVL may be on the same layer as the first electrode SE and the second electrode DE. A lower-side conductive layer usable as a wire may be positioned between the substrate 110 and the buffer layer 120 (refer to FIG. 4), and the lower-side conductive layer may be on the same layer as the light blocking layer BL.

The semiconductor layer AL, the gate electrode GE, the first electrode SE, and the second electrode DE may configure the transistor TR. The shown transistor TR may correspond to the first transistor T1 in the pixel PX of FIG. 2.

A planarization layer 180 may be positioned on the first electrode SE and the second electrode DE. The planarization layer 180 may include an organic insulating material such as a general-purpose polymer such as poly(methyl methacrylate) or polystyrene, a polymer derivative having a phenol-based group, an acryl-based polymer, an imide-based polymer (e.g., a polyimide), an acryl-based polymer, a siloxane-based polymer, or a combination thereof.

A pixel electrode PE of the light emitting diode LED may be positioned on the planarization layer 180. The pixel electrode PE may be connected to the first electrode SE through a contact hole formed in the planarization layer 180. The pixel electrode PE may be made of a reflective conductive material, a semi-transmissive conductive material, or a transparent conductive material. The pixel electrode PE may include the transparent conductive material such as an indium tin oxide (ITO) or an indium zinc oxide (IZO). The pixel electrode PE may include a metal such as lithium (Li), calcium (Ca), aluminum (Al), silver (Ag), magnesium (Mg), gold (Au), or a combination thereof. The pixel electrode PE may have a multi-layered structure, for example, a triple-layered structure such as ITO/silver (Ag)/ITO.

A pixel defining layer 185 including an opening OP overlapping the pixel electrode PE may be positioned on the planarization layer 180. The pixel defining layer 185 may include an organic insulating material such as an acryl-based polymer, an imide-based polymer, and/or an amide-based polymer. The pixel defining layer 185 may include a black pigment. For example, the pixel defining layer 185 may include a polyimide binder and red, green, and blue pigments. The pixel defining layer 185 may include a cardo binder resin and a mixture of a lactam black pigment and a blue pigment. The pixel defining layer 185 may include carbon black. The pixel defining layer 185 including a black pigment may increase a contrast ratio and may prevent reflection caused by the metal layer positioned on a lower portion.

An emission layer EL may be positioned on the pixel electrode PE and the pixel defining layer 185. The emission layer EL may be positioned on the pixels PX1, PX2, and PX3. The emission layer EL may contact the pixel electrode PE through the opening OP of the pixel defining layer 185. Differing from what is shown, the emission layer EL may be positioned in the opening OP of the pixel defining layer 185. The emission layer EL may include a light emitting material for emitting blue light. The emission layer EL may include a light emitting material for emitting red light or green light in addition to the blue light. The emission layer EL may include multiple emission layers, and the emission layers may include emission layers for emitting light of the same color or may include emission layers for emitting light of different colors. For example, the emission layer EL may have a structure in which three blue emission layers may be stacked on each other. As another example, the emission layer EL may have a structure in which three blue emission layers and one green emission layer may be stacked on each other. At least one of a hole injection layer, a hole transfer layer, an electron transfer layer, and an electron injection layer may be positioned on the pixel electrode PE in addition to the emission layer EL.

A common electrode CE may be positioned on the emission layer EL. The common electrode CE may be positioned on the pixels PX1, PX2, and PX3. The common electrode CE may include a metal such as calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), or a combination thereof. The common electrode CE may include a transparent conductive oxide such as an indium tin oxide (ITO) or an indium zinc oxide (IZO).

The pixel electrode PE, the emission layer EL, and the common electrode CE may configure a light emitting diode LED that may be an organic light emitting diode. The pixel electrode PE may be respectively provided for the pixels PX1, PX2, and PX3 and may receive a driving current. The common electrode CE may be provided in common to the pixels PX1, PX2, and PX3 and may receive a common voltage. The pixel electrode PE may be an anode that may be a hole injection electrode, the common electrode CE may be a cathode that may be an electron injection electrode, and vice versa. The opening OP of the pixel defining layer 185 may correspond to a light emitting region of the light emitting diode LED.

An encapsulation layer 190 may be positioned on the common electrode CE. The encapsulation layer 190 may seal the light emitting diodes LED, and may prevent moisture or oxygen from permeating from the outside. The encapsulation layer 190 may cover the entire display area DA, and an edge of the encapsulation layer 190 may be positioned in the non-display area NA.

The encapsulation layer 190 may be a thin film encapsulation layer including a first inorganic layer 191, a second inorganic layer 193, and an organic layer 192. The first inorganic layer 191 and the second inorganic layer 193 may generally prevent permeation of moisture, and the organic layer 192 may generally planarize a surface of the encapsulation layer 190, particularly a surface of the second inorganic layer 193 in the display area DA. The first inorganic layer 191 and the second inorganic layer 193 may include an inorganic insulating material such as a silicon oxide or a silicon nitride. The organic layer 192 may include an organic material such as an acryl-based resin, a methacryl-based resin, polyisoprene, a vinyl-based resin, an epoxy-based resin, a urethane-based resin, a cellulose-based resin, a perylene-based resin, or a combination thereof.

The first inorganic layer 191 and the second inorganic layer 193 may be formed to be wider than the organic layer 192, and the first inorganic layer 191 may contact the second inorganic layer 193 near an edge of the encapsulation layer 190. An edge of the first inorganic layer 191 may substantially correspond to an edge of the second inorganic layer 193. By forming the first inorganic layer 191 and the second inorganic layer 193 to be wide, moisture or oxygen may be prevented from permeating from a lateral side of the display area DA, and a permeating path of moisture or oxygen may become long and complicated so the permeation may be delayed.

Dams DM1, DM2, and DM3 may be positioned in the non-display area NA. The dams DM1, DM2, and DM3 may prevent an organic material such as a monomer from overflowing in case that the organic layer 192 of the encapsulation layer 190 is formed, and hence, an edge of the organic layer 192 of the encapsulation layer 190 may be generally provided to a further inner side than the dams DM1, DM2, and DM3, for example, it may be positioned between the dams DM1, DM2, and DM3 and the display area DA. The first inorganic layer 191 and the second inorganic layer 193 of the encapsulation layer 190 may extend above the dams DM1, DM2, and DM3 to cover the dams DM1, DM2, and DM3. As a contact area of the first inorganic layer 191 and the second inorganic layer 193 increases, an adhesive force between the first inorganic layer 191 and the second inorganic layer 193 may increase.

The respective dams DM1, DM2, and DM3 may surround the display area DA. The first dam DM1 may be positioned nearer the display area DA than the second dam DM2 is, and the third dam DM3 may be positioned farther from the display area DA than the second dam DM2 is. The dams DM1, DM2, and DM3 may be formed to be at least one layer, and the dams DM1, DM2, and DM3 may be formed by using insulating layers formed in the display area DA. For example, the first dam DM1 may be a single layer and may be on the same layer as the planarization layer 180 or the pixel defining layer 185. The second dam DM2 and the third dam DM3 may be multiple layers, the lower layer may be formed on the same layer as the planarization layer 180, and the upper layer may be formed on the same layer as the pixel defining layer 185. Three dams DM1, DM2, and DM3 are shown, and the number of the dams may be variable.

A mask support MS may be positioned in the non-display area NA. The above-described emission layer EL, the common electrode CE, and the inorganic layers 191 and 193 of the encapsulation layer 190 may be formed by depositing the same by use of a metal mask in which regions in which corresponding layers will be formed are opened. The mask support MS may support the metal mask. The mask support MS may be spaced from the dams DM1, DM2, and DM3. The mask support MS may be positioned farther from the display area DA than the dams DM1, DM2, and DM3 may be. The mask support MS may be formed to be at least one layer. The mask support MS may be multiple layers. For example, the mask support MS may include a lower layer formed to be on the same layer as the planarization layer 180 and an upper layer formed to be on the same layer as the pixel defining layer 185.

The color converting unit 200 to be bonded to the display unit 100 by the sealant 300 surrounding the edge of the display panel 10 may be positioned on the encapsulation layer 190.

The color converting unit 200 may include a substrate 210. The substrate 210 may include an insulating material such as glass or plastic, and for example, the substrate 110 may be a glass substrate.

Color filters 230a, 230b, and 230c may be positioned on the substrate 210 in a direction that goes toward the display unit 100. The color filters 230a, 230b, and 230c may overlap the openings OP of the pixel defining layer 185 in the display area DA. The color filters 230a, 230b, and 230c may include a first color filter 230a for transmitting light with a first wavelength and absorbing light with other wavelengths, a second color filter 230b for transmitting light with a second wavelength and absorbing light with other wavelengths, and a third color filter 230*c* for transmitting light with a third wavelength and absorbing light with other wavelengths. The first color filter 230*a*, the second color filter 230*b*, and the third color filter 230*c* may respectively overlap the first pixel PX1, the second pixel PX2, and the third pixel PX3. Accordingly, purities of the light with a first wavelength (corresponding to the first pixel PX1) output to the outside of the display panel 10, the light with a second wavelength (corresponding to the second pixel PX2), and the light with a third wavelength (corresponding to the third pixel PX3) may be increased. The light with a first wavelength, the light with a second wavelength, and the light with a third wavelength may respectively be red light, green light, and blue light.

The first color filter 230*a*, the second color filter 230*b*, and the third color filter 230*c* may overlap each other to form a light blocking region on a boundary of the pixels PX1, PX2, and PX3. The first color filter 230*a*, the second color filter 230*b*, and the third color filter 230*c* may overlap each other to form a light blocking region as shown above, and two color filters may overlap each other to form a light blocking region. For example, the first color filter 230*a* and the second color filter 230*b* may overlap each other on the boundary of the first pixel PX1 and the second pixel PX2, the second color filter 230*b* and the third color filter 230*c* may overlap each other on the boundary of the second pixel PX2 and the third pixel PX3, and the third color filter 230*c* and the first color filter 230*a* may overlap each other on the boundary of the third pixel PX3 and the first pixel PX1. The first color filter 230*a*, the second color filter 230*b*, and the third color filter 230*c* may overlap each other to form a light blocking region in the non-display area NA. The third color filter 230*c*, the first color filter 230*a*, and the second color filter 230*b* may be stacked on each other in order on the substrate 210, and may be stacked on each other in other orders. Instead of the overlapping of the color filters 230*a*, 230*b*, and 230*c*, the light blocking region may be formed by forming a light blocking member.

A low refractive index layer 240 may be positioned on the color filters 230*a*, 230*b*, and 230*c*. The low refractive index layer 240 may cover the entire substrate 210. The low refractive index layer 240 may include an organic material or an inorganic material having a refractive index. The refractive index of the low refractive index layer 240 may be about 1.1 to about 1.3. The low refractive index layer 240 may be disposed on a position that may be different from what is shown. For example, the low refractive index layer 240 may be positioned among color converting layers 270*a* and 270*b*, a transmission layer 270*c*, and a second capping layer 280. The color converting unit 200 may include multiple low refractive index layers. For example, the color converting unit 200 may further include a low refractive index layer positioned among the color converting layers 270*a* and 270*b*, the transmission layer 270*c*, and the second capping layer 280 in addition to the low refractive index layer 240 positioned among the color filters 230*a*, 230*b*, and 230*c* and the first capping layer 250.

A first capping layer 250 may be positioned on the low refractive index layer 240. The first capping layer 250 may generally cover the low refractive index layer 240 and may protect the low refractive index layer 240. The first capping layer 250 may include an inorganic insulating material such as a silicon oxide, a silicon nitride, and/or a silicon oxynitride, and may be a single layer or a multilayer.

A bank 260 and a dummy bank 265 may be positioned on the first capping layer 250. The bank 260 may be positioned in the display area DA and may overlap the pixel defining layer 185. The bank 260 may overlap the light blocking region in which the first color filter 230*a*, the second color filter 230*b*, and the third color filter 230*c* overlap each other. The bank 260 may be positioned on the boundary of the pixels PX1, PX2, and PX3. The bank 260 may partition a pixel area. The dummy bank 265 may be positioned in the non-display area NA. The dummy bank 265 may surround the display area DA. The dummy bank 265 may be connected to the bank 260, and the dummy bank 265 may be integrally formed with the bank 260. The bank 260 and the dummy bank 265 may be formed with a same material in a same process. The bank 260 and the dummy bank 265 may include an organic insulating material such as an acryl-based polymer, an imide-based polymer, and/or an amide-based polymer. The bank 260 may be a black bank including a colored pigment such as a black pigment, or it may be transparent.

Referring to FIG. 4 and FIG. 5, a pattern SP may be positioned on the first capping layer 250 in the non-display area NA. The pattern SP may surround the display area DA, and may be positioned between the edge of the display panel 10 and the display area DA. The pattern SP may be connected to the dummy bank 265. The pattern SP may be integrally formed with the dummy bank 265. A border of the pattern SP and the dummy bank 265 is marked with a dotted line. The dummy bank 265 may be spaced from the sealant 300 by equal to or greater than, for example, 1000 μm, 1500 μm, or 2000 μm, and the pattern SP may be positioned between the dummy bank 265 and the sealant 300.

A portion of the pattern SP adjacent to the dummy bank 265 may be thicker than a portion of the pattern SP adjacent to the sealant 300. The thickness t of the pattern SP may be gradually reduced toward an outside of the display panel 10 (i.e., going to an outside of the color converting unit 200, going to an outside of the substrate 210, or going toward the sealant 300). The pattern SP may have a staircase structure in which the thickness t of the pattern SP may be reduced by stages toward the outside of the display panel 10 (or a height from the first capping layer 250 may be reduced). Regarding the staircase structure of the pattern SP, the respective stairs may include a flat region with a thickness, and corners of the respective stairs may be formed to be round. The flat region may be substantially parallel to the plane of the substrate 210. Widths of the respective stairs may be equal to or greater than 10 μm.

The staircase structure of the pattern SP may include at least three stairs, for example, four stairs as shown. The stairs that may be the nearest to the dummy bank 265 in the staircase structure of the pattern SP may have about 50% to about 100% the thickness of the dummy bank 265. The stairs that may be the farthest from the dummy bank 265 in the staircase structure of the pattern SP may have about 10% to about 50% the thickness of the dummy bank 265. In case that the pattern SP is formed to have four stairs, the thicknesses t of the respective stairs in order of being adjacent to the dummy bank 265 may be, for example, about 100%, about 70%, about 50%, and about 30% the thickness of the dummy bank 265. Ratios of the thicknesses of the respective stairs may be variable in multiple ways.

In case that the pattern SP is formed as described, the filler 400 may be spread wide to the outside of the display panel 10 while not hindering formation of the sealant 300. For example, the filler 400 may be spread to reach the region that overlaps the mask support MS or more. By this, the pattern SP and the filler 400 may support the color converting unit 200 and the display unit 100 on the side of the display panel 10, thereby preventing or improving the drooping of the color converting unit 200 or the display unit 100. Pressing resistance between the display unit 100 and the color converting unit 200 may be increased by reducing a space between the display unit 100 and the color converting unit 200 on the outside of the display panel 10. An edge of the pattern SP may be spaced from the sealant 300 by an interval d, and may substantially contact or overlap the same.

The pattern SP may be made with a same material as the bank 260 and the dummy bank 265 in a same process. The pattern SP, the bank 260, and the dummy bank 265 may be positioned between the first capping layer 250 and the second capping layer 280. First sides of the pattern SP, the bank 260, and the dummy bank 265 may respectively contact the first capping layer 250, and second sides thereof may contact the second capping layer 280. The pattern SP may include an organic insulating material such as an acryl-based polymer, an imide-based polymer, or an amide-based polymer. The pattern SP may include a colored pigment such as a black pigment.

The pattern SP with a staircase structure may be made by using a photomask such as a slit mask, a halftone mask, or a multitone mask. For example, in case that a photosensitive organic material is coated on the first capping layer 250, beams may be selectively irradiated by using photomasks with different light transmittance or exposure depending on regions, and they may be developed and baked so that the bank 260, the dummy bank 265, and the pattern SP may be simultaneously formed. Hence, there may be no need to use an additional process or a photomask for forming the pattern SP.

In case that the pattern SP has a four-staircase structure, the stairs with different thicknesses may be formed by using a multitone mask including four regions with different values of light transmittance. For example, in case that the pattern SP is to be formed so that the thicknesses t of the respective stairs of the pattern SP may be about 100%, about 70%, about 50%, and about 30% the thickness of the dummy bank 265, a negative photosensitive organic material may be coated and an exposure process may be performed by using a multitone mask in which light transmittance of the regions that correspond to the respective stairs may be about 100%, about 70%, about 50%, and about 30%. The regions corresponding to the bank 260 and the dummy bank 265 on the multitone mask may have the light transmittance of about 100%. In the case of a formation using a positive photosensitive organic material, the exposure process may be performed by using a multitone mask in which the light transmittance of the regions that correspond to respective stairs may be about 0%, about 30%, about 50%, and about 70%. The light transmittance of the respective regions of the multitone mask may be changed in various ways according to the thicknesses of the respective stairs of the pattern SP and types of the photosensitive organic material.

A first color converting layer 270a, a second color converting layer 270b, and a transmission layer 270c may be positioned on the first capping layer 250. The first color converting layer 270a, the second color converting layer 270b, and the transmission layer 270c may be positioned in a space (i.e., the opening of the bank 250) defined by the bank 260. The first color converting layer 270a, the second color converting layer 270b, and the transmission layer 270c may be partitioned or divided by the bank 260. A dummy color converting layer 270d (or a dummy transmission layer) may be positioned in a space defined by the dummy bank 265 in the non-display area NA. The display panel 10 may overlap the dummy bank 265, or may not include a light emitting diode LED overlapping the space defined by the dummy bank 265. The display panel 10 may not include the light emitting diode LED overlapping the dummy color converting layer 270d. The first color converting layer 270a, the second color converting layer 270b, the transmission layer 270c, and the dummy color converting layer 270d may be formed by an inkjet printing process.

The first color converting layer 270a may overlap the first color filter 230a. The first color converting layer 270a may overlap the light emitting diode LED that corresponds to the first pixel PX1, and may convert the light input by the light emitting diode LED into light with a first wavelength. The light with a first wavelength may be red light with a maximum light emitting peak wavelength of about 600 nm to about 650 nm, for example, about 620 nm to about 650 nm.

The second color converting layer 270b may overlap the second color filter 230b. The second color converting layer 270b may overlap the light emitting diode LED that corresponds to the second pixel PX2, and may convert the light input by the light emitting diode LED into light with a second wavelength. The light with a second wavelength may be green light with the maximum light emitting peak wavelength of about 500 nm to about 550 nm, for example, about 510 nm to about 550 nm.

The transmission layer 270c may overlap the third color filter 230c. The transmission layer 270c may overlap the light emitting diode LED that corresponds to the third pixel PX3, and may transmit the light input by the light emitting diode LED. The light having transmitted through the transmission layer 270c may be light with a third wavelength. The light with a third wavelength may be blue light with the maximum light emitting peak wavelength of about 380 nm to about 480 nm, for example, equal to or greater than about 420 nm, equal to or greater than about 430 nm, equal to or greater than about 440 nm, or equal to or greater than about 445 nm, and equal to or less than about 470 nm, equal to or less about 460 nm, or equal to or less than about 455 nm.

The first color converting layer 270a and the second color converting layer 270b may respectively include first quantum dots and second quantum dots. For example, light input to the first color converting layer 270a may be converted into the light with a first wavelength by the first quantum dots and may be discharged. The light input to the second color converting layer 270b may be converted into the light with a second wavelength by the second quantum dots and may be discharged. The first color converting layer 270a, the second color converting layer 270b, and the transmission layer 270c may include scatterers. The scatterers may scatter the light input to the first color converting layer 270a, the second color converting layer 270b, and the transmission layer 270c to increase light efficiency.

The first quantum dot and the second quantum dot (the quantum dots will also be referred to as semiconductor nanocrystals) may independently include a group II-VI compound, a group III-V compound, a group IV-VI compound, a group IV element or compound, a group compound, a group compound, a group I-II-IV-VI compound, or a combination thereof.

The group II-VI compound may be selected from among a binary compound selected from among CdSe, CdTe, ZnS, ZnSe, ZnTe, ZnO, HgS, HgSe, HgTe, MgSe, MgS, and a mixture thereof; a tertiary compound selected from among AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from among CdZnSeS, CdZnSeTe, CdZnSTe, CdHgSeS, CdHgSeTe, CdHgSTe, HgZnSeS, HgZnSeTe, HgZnSTe, and a mixture thereof. The group II-VI compound may further include a group III metal.

The group III-V compound may be selected from among a binary compound selected from among GaN, GaP, GaAs, GaSb, AlN, AlP, AlAs, AlSb, InN, InP, InAs, InSb, and a mixture thereof; a tertiary compound selected from among GaNP, GaNAs, GaNSb, GaPAs, GaPSb, AlNP, AlNAs, AlNSb, AlPAs, AlPSb, InGaP, InNP, InNAs, InNSb, InPAs, InZnP, InPSb, and a mixture thereof; and a quaternary compound selected from among GaAlNP, GaAlNAs, GaAl-NSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The group III-V compound may further include a group II metal.

The group IV-VI compound may be selected from among a binary compound selected from among SnS, SnSe, SnTe, PbS, PbSe, PbTe, and a mixture thereof; a tertiary compound selected from among SnSeS, SnSeTe, SnSTe, PbSeS, PbSeTe, PbSTe, SnPbS, SnPbSe, SnPbTe, and a mixture thereof; and a quaternary compound selected from among SnPbSSe, SnPbSeTe, SnPbSTe, and a mixture thereof.

The group IV element or compound may be selected from among a unary compound selected from among Si, Ge, and a combination thereof; and a binary compound selected from among SiC, SiGe, and a combination thereof.

The group compound may be selected from among $CuInSe_2$, $CuInS_2$, CuInGaSe, and CuInGaS.

The group compound may be selected from among ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, and a combination thereof.

The group I-II-IV-VI compound may be selected from among CuZnSnSe and CuZnSnS.

The quantum dot may not include cadmium. The quantum dot may include a semiconductor nanocrystal based on the group III-V compound including indium and phosphorus. The group III-V compound may further include zinc. The quantum dot may include a semiconductor nanocrystal based on the group II-VI compound including a chalcogen (e.g., sulfur, selenium, tellurium, or a combination thereof) and zinc.

Regarding the quantum dot, the above-described binary compound, tertiary compound, and/or quaternary compound may exist in the particles with uniform concentration, or may exist in the same particles with a concentration distribution partially divided into some states. Further, the color conversion media layer may have a core/shell structure where one quantum dot surrounds another quantum dot. An interface between the core and the shell may have a concentration gradient such that a concentration of an element existing in the shell may be gradually reduced nearing the center thereof.

In some embodiments, the quantum dot may have a core-shell structure including a core including the above-described nanocrystal and a shell surrounding the core. The shell of the quantum dot may function as a protective layer for maintaining the semiconductor characteristic by preventing chemical denaturation of the core and/or a charging layer for providing an electrophoretic characteristic to the quantum dot. The shell may be a single layer or a multilayer. An interface between the core and the shell may have a concentration gradient such that a concentration of an element existing in the shell may be gradually reduced nearing the center thereof. Examples of the shell of the quantum dot include a metallic or non-metallic oxide, a semiconductor compound, or a combination thereof.

The metallic or non-metallic oxide may include binary compounds such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or a combination thereof, or tertiary compounds such as $MgAl_2O_4$, $CoFe_2O_4$, $NiFe_2O_4$, or $CoMn_2O_4$, or a combination thereof.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, or a combination thereof.

A quantum dot may have a full width at half maximum of a light-emitting wavelength spectrum that may be less than about 45 nm, less than about 40 nm, or less than about 30 nm, and it may improve color purity or color reproducibility within this range. Light emitted through the quantum dot may be output in all directions, thereby improving a viewing angle.

Regarding the quantum dot, a shell material and a core material may have different energy bandgaps. For example, the energy bandgap of the shell material may be greater or less than the energy bandgap of the core material. The quantum dot may have a multi-layered shell. Regarding the multi-layered shell, the energy bandgap of an outer layer may be greater than the energy bandgap of an inner layer (i.e., a layer that may be near the core). Regarding the multi-layered shell, the energy bandgap of the outer layer may be less than the energy bandgap of the inner layer.

A shape of the quantum dot is not specifically limited. For example, the shape of the quantum dot may include a sphere, a polyhedron, a pyramid, a multipod, a square, a cuboid, a nanotube, a nanorod, a nanowire, a nanosheet, or a combination thereof.

The quantum dot may include an organic ligand (e.g., having a hydrophobic residue and/or a hydrophilic residue). The organic ligand residue may be combined to the surface of the quantum dot. The organic ligand may include RCOOH, $RNH_2$, $R_2NH$, $R_3N$, RSH, $R_3PO$, $R_3P$, ROH, RCOOR, RPO $(OH)_2$, RHPOOH, $R_2POOH$, or a combination thereof. Here, R may independently be a C3 to C40 substituted or unsubstituted aliphatic hydrocarbon group such as a C3 to C40 (e.g., C5 to C24) substituted or unsubstituted alkyl group, or a substituted or unsubstituted alkenyl group, a C6 to C40 (e.g., C6 to C20) substituted or unsubstituted aromatic hydrocarbon group such as a C6 to C40 substituted or unsubstituted aryl group, or a combination thereof.

Examples of the organic ligand may include thiol compounds such as methane thiol, ethane thiol, propane thiol, butane thiol, pentane thiol, hexane thiol, octane thiol, dodecane thiol, hexadecane thiol, octadecane thiol, or benzyl thiol; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine compounds such as methyl phosphine, ethyl phosphine, propyl phosphine, butyl phosphine, pentyl phosphine, octyl phosphine, dioctyl phosphine, tributyl phosphine, or trioctyl phosphine; phosphine compounds or their oxide compounds such as methyl phosphine oxide, ethyl phosphine oxide, propyl phosphine oxide, butyl phosphine oxide, pentyl phosphine oxide, tributyl phosphine oxide, octyl phosphine oxide, dioctyl phosphine oxide, trioctyl phosphine oxide, diphenyl phosphine, a triphenyl phosphine compound or oxide compounds thereof; and C5 to C20 alkyl phosphinic acids such as hexylphosphinic acid, octylphosphinic acid, dodecanephosphinic acid, tetradecanephosphinic acid, hexadecanephosphinic acid, octadecanephosphinic acid, and C5 to C20 alkyl phosphonic acids, or combinations thereof. The quantum dot may include the organic ligand alone or as a mixture of at least one kind. The hydrophobic organic ligand may not include a photopolymerizable residue (e.g., an acrylate or methacrylate).

A second capping layer 280 may be positioned on the bank 260, the dummy bank 265, and the pattern SP. The second capping layer 280 may generally cover the substrate 210. The second capping layer 280 may cover the first color converting layer 270a, the second color converting layer 270b, the transmission layer 270c, and the dummy color converting layer 270d. The second capping layer 280 may include an inorganic insulating material such as a silicon oxide, a silicon nitride, or a silicon oxynitride, and may be a single layer or a multilayer.

The low refractive index layer 240, the first capping layer 250, and the second capping layer 280 may cover lateral sides of the color filters 230a, 230b, and 230c on an edge of the color converting unit 200. The low refractive index layer 240, the first capping layer 250, and the second capping layer 280 may be formed up to an edge of the substrate 210, and the low refractive index layer 240 may contact the substrate 210 on an edge of the color converting unit 200. The low refractive index layer 240, the first capping layer 250, and the second capping layer 280 may form a blocking member for preventing moisture or oxygen from permeating from the edge of the color converting unit 200.

A filler 400 may be positioned between the color converting unit 200 and the display unit 100. A first side of the filler 400 may contact the second capping layer 280, and a second side of the filler 400 may contact the encapsulation layer 190. The filler 400 may charge a space between the display unit 100 and the color converting unit 200 to increase pressing resistance between the display unit 100 and the color converting unit 200. The filler 400 may be formed in case that a charging material is applied on the second capping layer 280 and the display unit 100 is overlapped thereon and is cured. The filler 400 may include an organic material such as an epoxy resin.

A sealant 300 may be positioned between the display unit 100 and the color converting unit 200. The sealant 300 may completely surround the display area DA. The sealant 300 may bond the display unit 100 and the color converting unit 200, and may prevent moisture or oxygen from permeating between the display unit 100 and the color converting unit 200. The sealant 300 may be formed by printing a sealing material on the display unit 100, overlapping the display unit 100 and the color converting unit 200, so that the sealing material may be positioned between the display unit 100 and the color converting unit 200, and curing the sealing material. The sealing material may include an organic material such as an epoxy resin, a phenol resin, an acryl resin, and/or a urethane resin. The sealing material may be photosetting and/or thermosetting. An inorganic material such as a glass frit may be used as a sealing material.

The sealant 300 and the filler 400 may be substantially simultaneously formed. For example, a charging material may be applied on the second capping layer 280 of the color converting unit 200, a sealing material may be printed on the display unit 100, and the display unit 100 may be closely attached to the color converting unit 200. A sealant 300 for bonding the display unit 100 and the color converting unit 200 may be formed by irradiating ultraviolet rays (UV) to the sealing material to cure the same. The filler 400 may be formed by applying heat to the display panel 10 to which the display unit 100 and the color converting unit 200 may be bonded and curing the charging material. In case that the filler 400 is thermoset, the sealant 300 may be baked. The sealing material may be printed on the color converting unit 200.

In case that the display unit 100 is bonded to the color converting unit 200, the sealing material may be spread. In case that the pattern SP is disposed between the sealant 300 and the dummy bank 265, the drooping of the color converting unit 200 or the display unit 100 may be improved, and a force may not be uniformly applied to the sealing material and may be further spread to the outside of the display panel 10 by the pattern SP. For example, in case that they are bonded, the sealing material may be pressed and may be spread to the inside and the outside of the display panel 10, and its spreading to the inside may be controlled by the pattern SP and it may be further spread to the outside. In case that the sealing material is further spread to the outside of the display panel 10, the formed sealant 300 violates a scribe line, and a trouble may be generated in a subsequent process (e.g., a process for cutting the display panel 10). However, as the pattern SP becomes thin as approaching to the sealant 300, it may not become a substantial hindrance for the sealing material to be spread to the inside of the display panel 10. As a result, the sealant 300 may be formed in a like way of the case in which the pattern SP may not be disposed near the sealant 300, and a support force of the color converting unit 200 of the pattern SP may be increased, thereby preventing or improving the drooping of the color converting unit 200 or the display unit 100.

Figure 6:
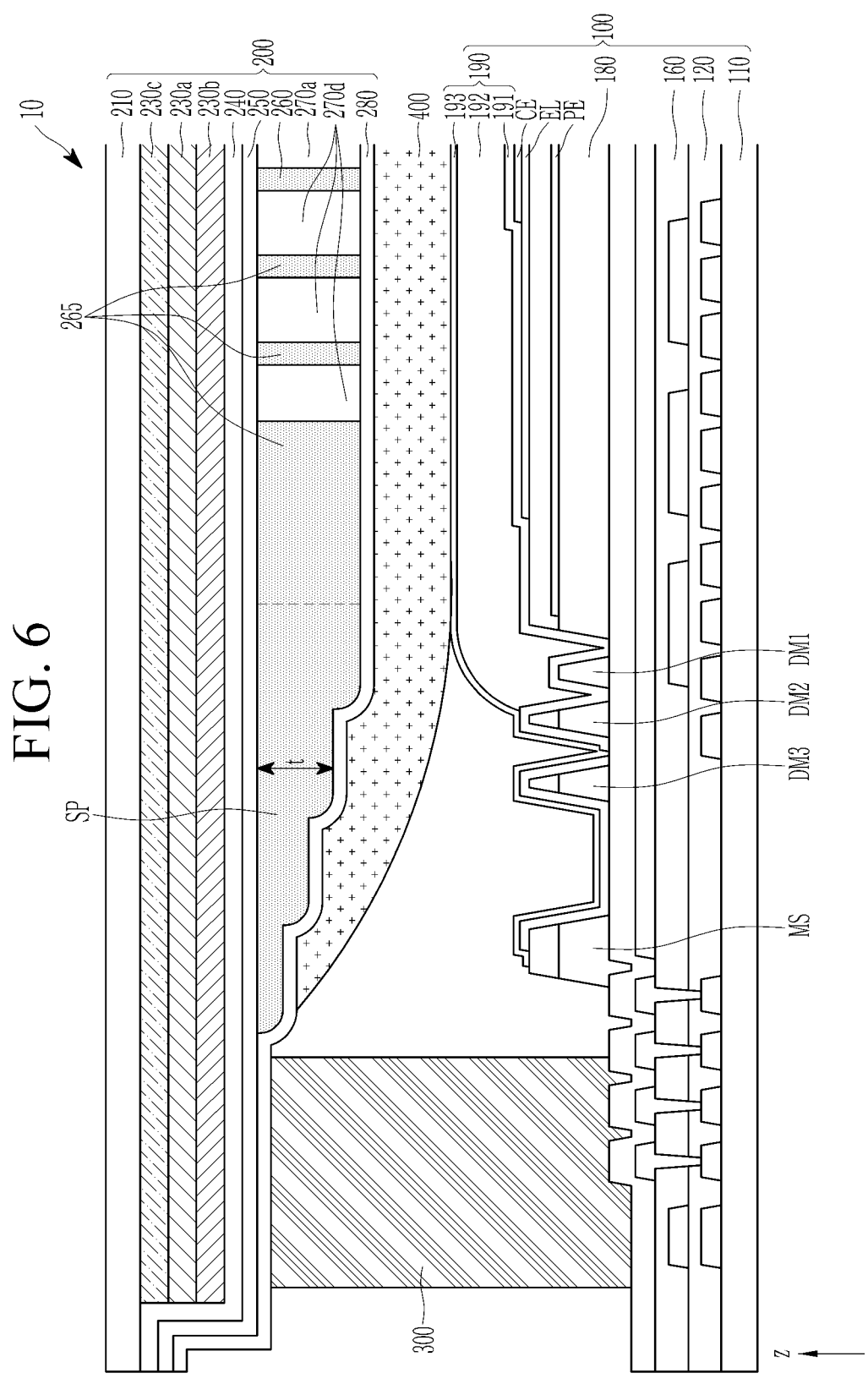
FIG. 6 shows a schematic cross-sectional view of a non-display area on a display panel according to an embodiment.

FIG. 6 shows a schematic cross-sectional view of a non-display area on a display panel according to an embodiment.

An embodiment described with reference to FIG. 6 may be different from the above-described embodiments, at least regarding the encapsulation layer 190. Referring to FIG. 6, the first inorganic layer 191 and the second inorganic layer 193 included by the encapsulation layer 190 may pass through the dams DM1, DM2, and DM3 and may reach the mask support MS. An edge of the first inorganic layer 191 and an edge of the second inorganic layer 193 may be positioned on the mask support MS. In case that the first inorganic layer 191 and the second inorganic layer 193 extend to reach the mask support MS, a contact area of the first inorganic layer 191 and the second inorganic layer 193 is increased, and the adhesive force between the first inorganic layer 191 and the second inorganic layer 193 may further be increased. As a height of the mask support MS may be increased by the thicknesses of the first inorganic layer 191 and the second inorganic layer 193, a gap between the display unit 100 and the color converting unit 200 on the outside of the display panel 10 and pressing resistance between the display unit 100 and the color converting unit 200 may be increased. The second inorganic layer 193 may cover the edge of the first inorganic layer 191, and by this, the drooping of the edge of the first inorganic layer 191 may be reduced.

Figure 7:
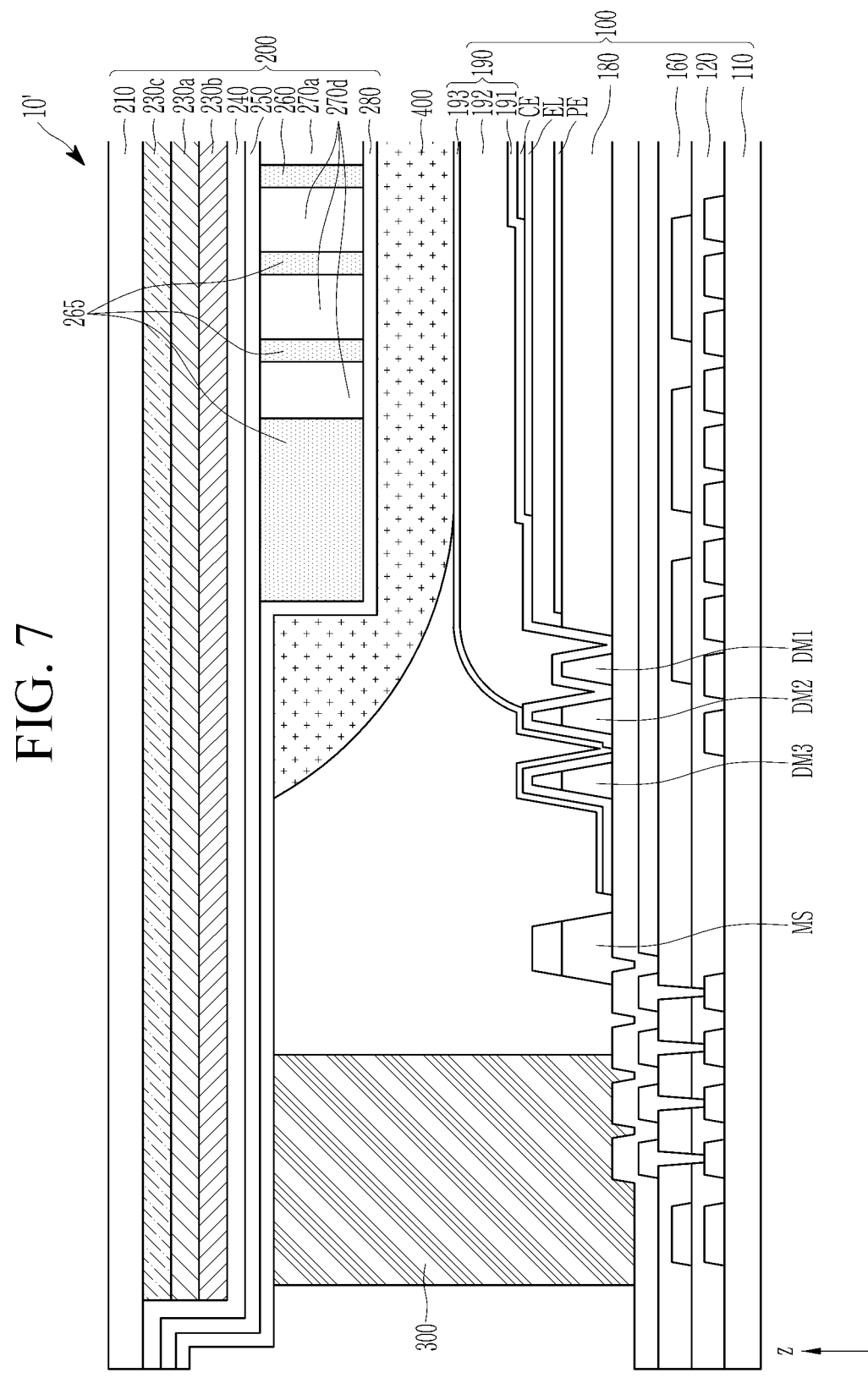
FIG. 7 shows a schematic cross-sectional view of a non-display area on a display panel according to a comparative example.

FIG. 7 shows a schematic cross-sectional view of a non-display area on a display panel according to a comparative example.

Referring to FIG. 7, differing from the above-described embodiments, the color converting unit 200 of the display panel 10' may not include a pattern between the dummy bank 265 and the sealant 300. Steep steps may be generated between the dummy bank 265 and the sealant 300 by an absence of pattern, and the filler 400 may not be widely spread to the outside of the display panel 10'. Accordingly, a substantial space may be formed between the display unit 100 and the color converting unit 200 on an edge of a border of the display panel 10' disposed near the sealant 300, the pressing resistance between the display unit 100 and the color converting unit 200 may be small so the color converting unit 200 or the display unit 100 may be drooped on the border of the display panel 10'. As a result, a difference of luminance may be generated between around the border of the display panel 10' and the internal region, so defects such as light leakage or stains may be manifested at the border. The defects may be reduced by forming the dummy bank 265 so that the dummy bank 265 may be positioned closer to the sealant 300, which may give an influence to a process control condition of the sealant 300 and the defect that the sealant 300 may be further spread to the outside of the display panel 10'. However, in a like way of the above-described embodiment, by forming the pattern SP of which the thickness may be reduced toward the sealant 300 between the dummy bank 265 and the sealant 300 while maintaining a spaced distance between the dummy bank 265 and the sealant 300, generation of the drooping of the color converting unit 200 or the display unit 100 and the expression of the defects caused by the same may be prevented while giving no influence to the process control condition of the sealant 300.

FIG. 8, FIG. 9, FIG. 10, FIG. 11, FIG. 12, and FIG. 13 show schematic cross-sectional views of a non-display area on a display panel according to embodiments.

Figure 8:
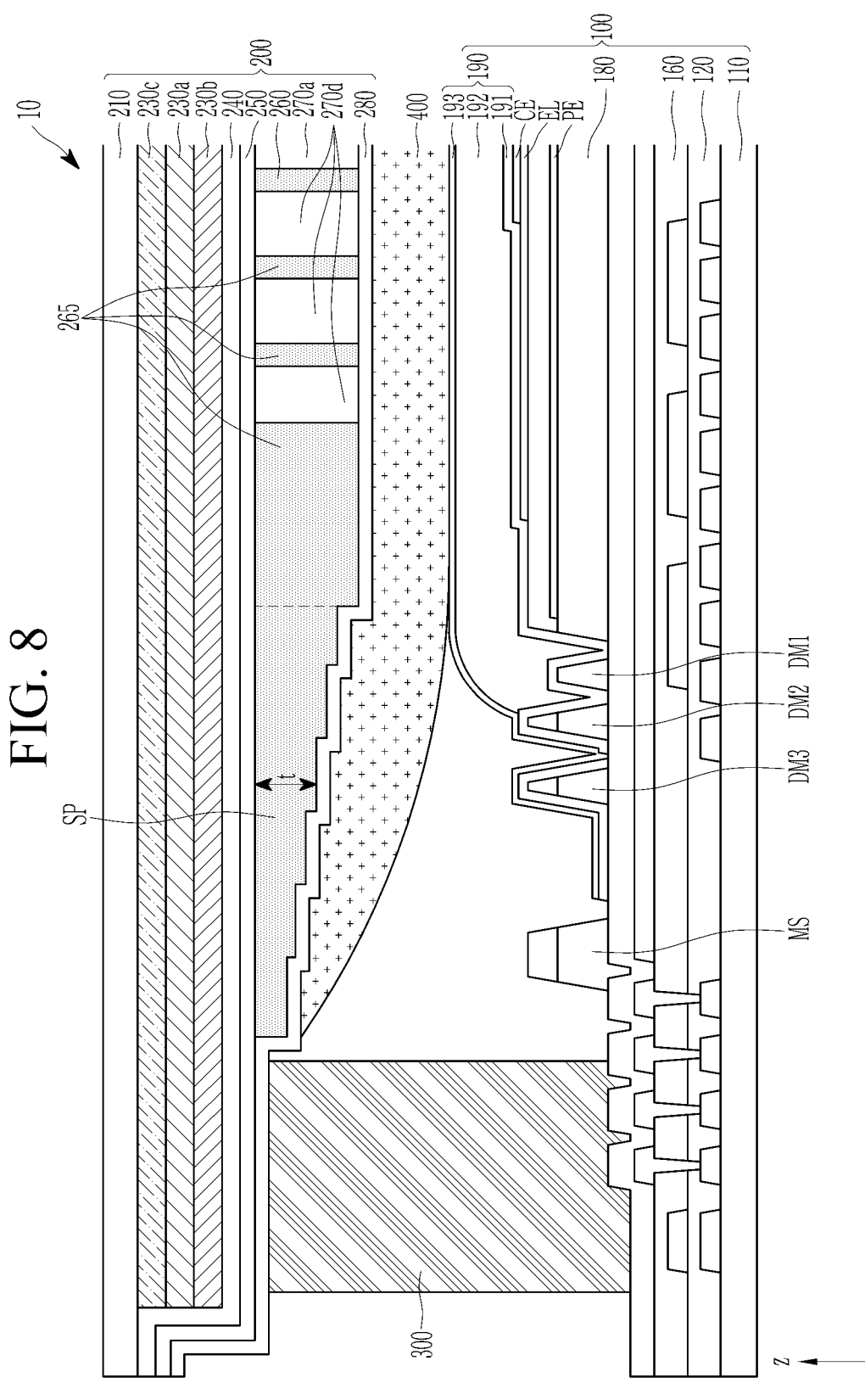
FIG. 8, FIG. 9, FIG. 10, FIG. 11, FIG. 12, and FIG. 13 show schematic cross-sectional views of a non-display area on a display panel according to embodiments.
Figure 9:
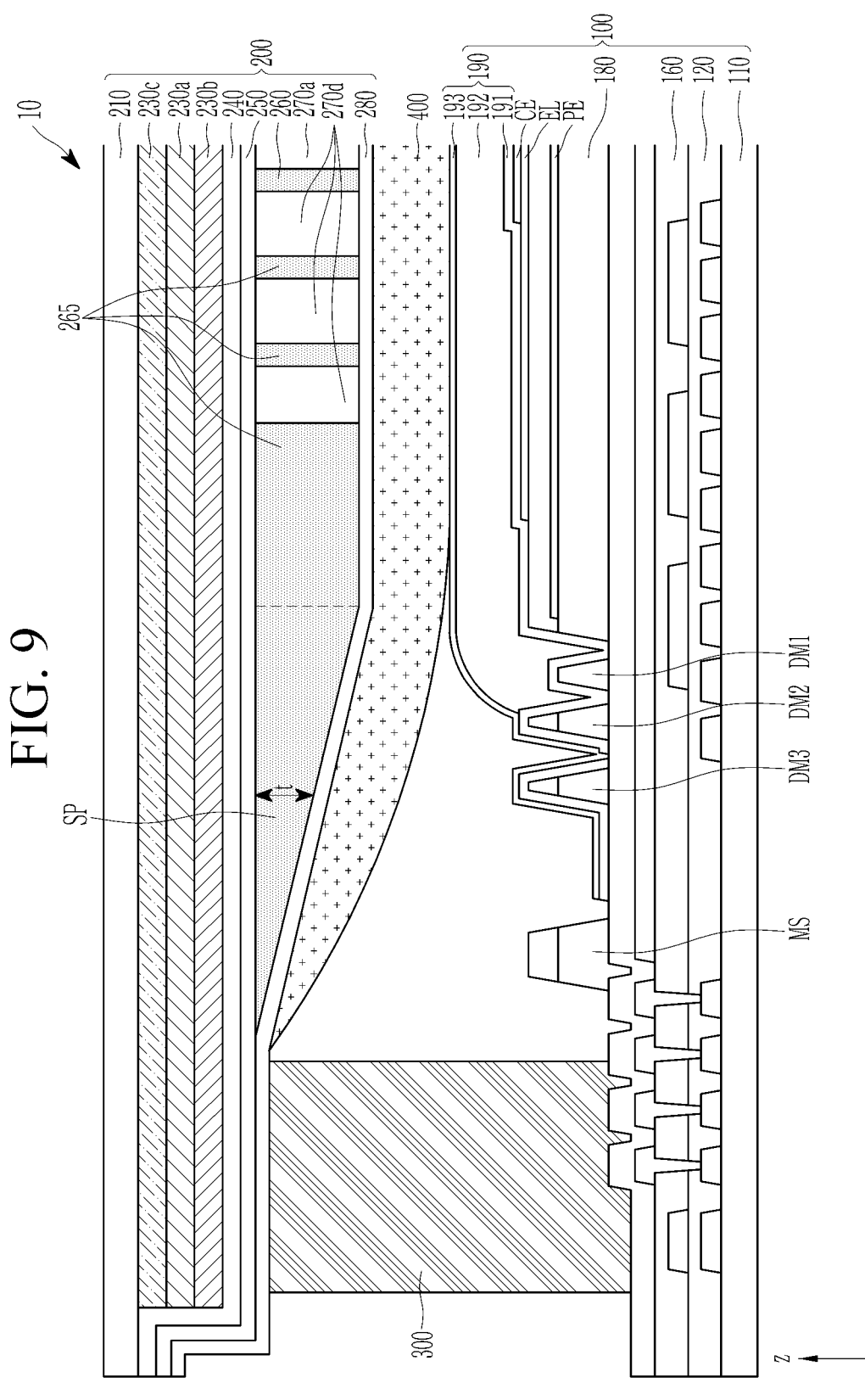

Referring to FIG. 8, the thickness t of the pattern SP may be reduced in a staircase structure as going toward the outside of the display panel 10. Differing from the embodiment described with reference to FIG. 4 in which corners of the respective stairs may be formed to be round, the corners of the respective stairs of the pattern SP may be formed to be angulated. The angle of the corners are shown to be about 90°, but it may be variable in multiple ways, for example, and its range may be about 90° to about 150°. The corners of the respective stairs may be formed to be round, angulated, gentle, or steep depending on the characteristics of the materials for forming the pattern SP or the formation method. The pattern SP formed with six stairs is disclosed, and the pattern SP may be formed with multiple stairs.

Figure 10:
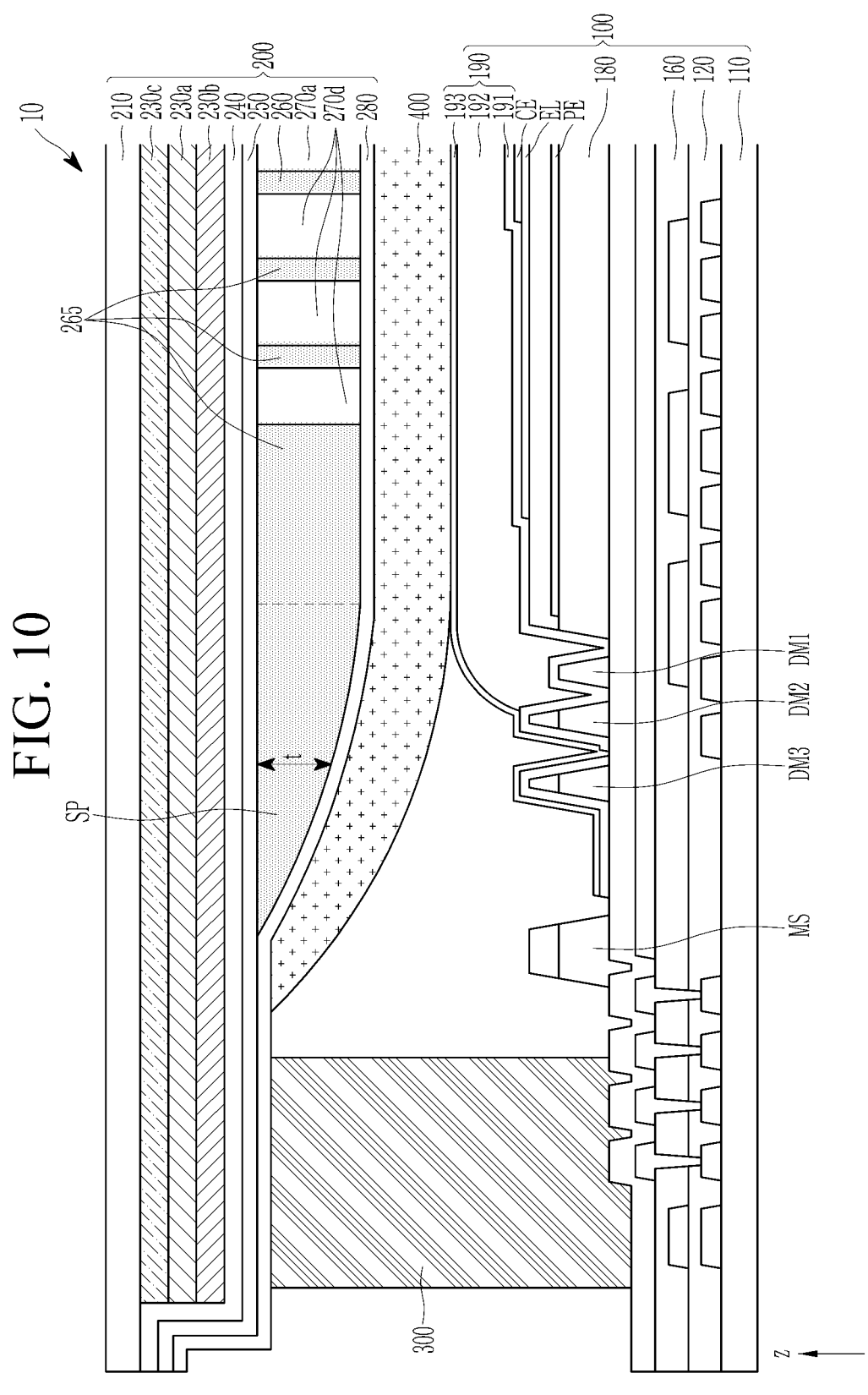
Figure 11:
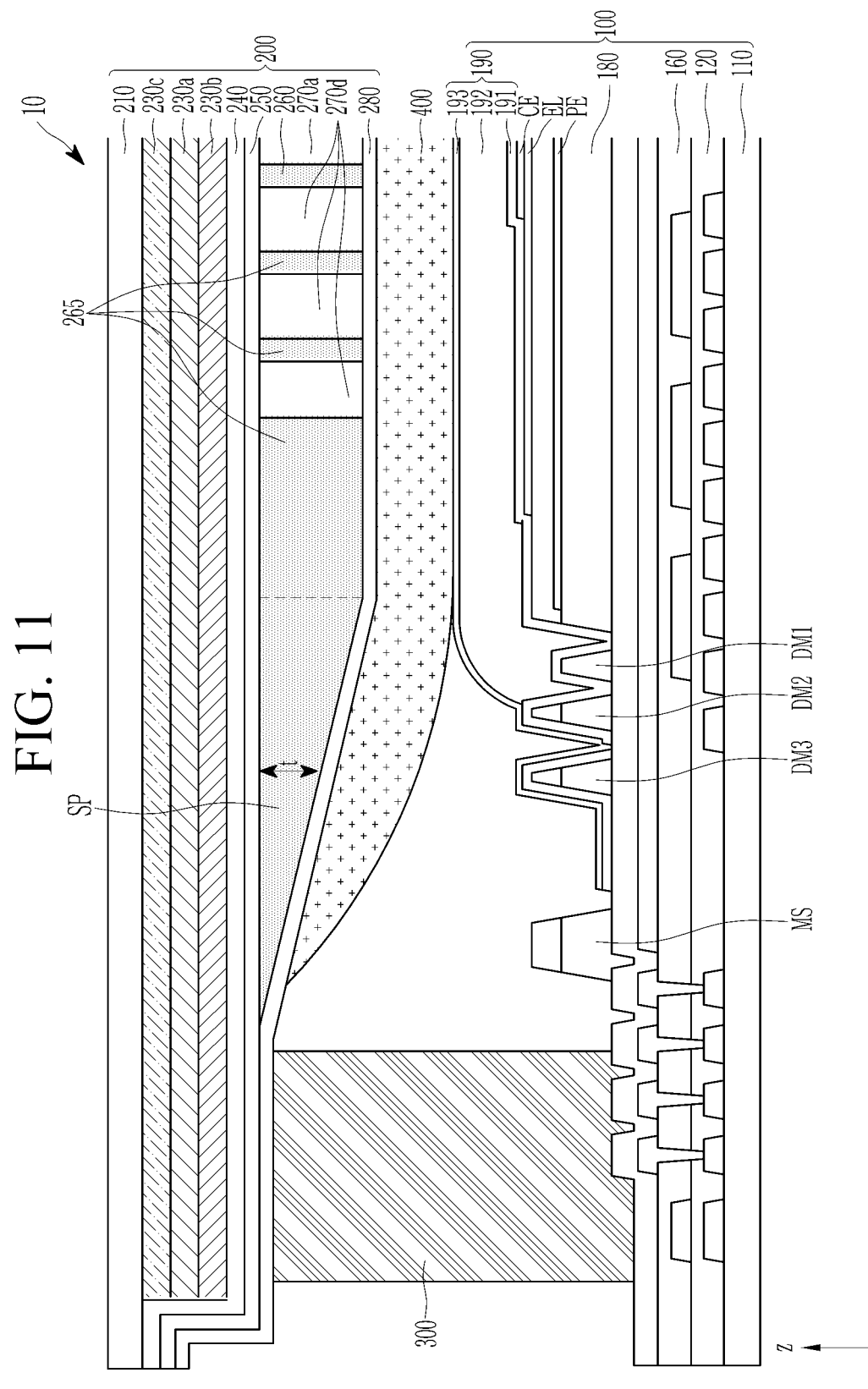

The example in which the pattern SP has a staircase structure has been described according to an embodiment described with reference to FIG. 4, and the pattern SP may have various types of structures. For example, referring to FIG. 9, the thickness t of the pattern SP may be reduced toward the outside of the display panel 10, and a slope for the thickness t to be reduced may be substantially constant. Referring to FIG. 10, the thickness t of the pattern SP may be reduced toward the outside of the display panel 10, and the slope for the thickness t to be reduced may be gradually increased. For example, an upper side of the pattern SP facing the display unit 100 may be convex from the substrate 210. Referring to FIG. 11, the thickness t of the pattern SP may be reduced toward the outside of the display panel 10, and the slope for the thickness t to be reduced may be gradually reduced. For example, the upper side of the pattern SP may be convex toward the substrate 210.

Figure 12:
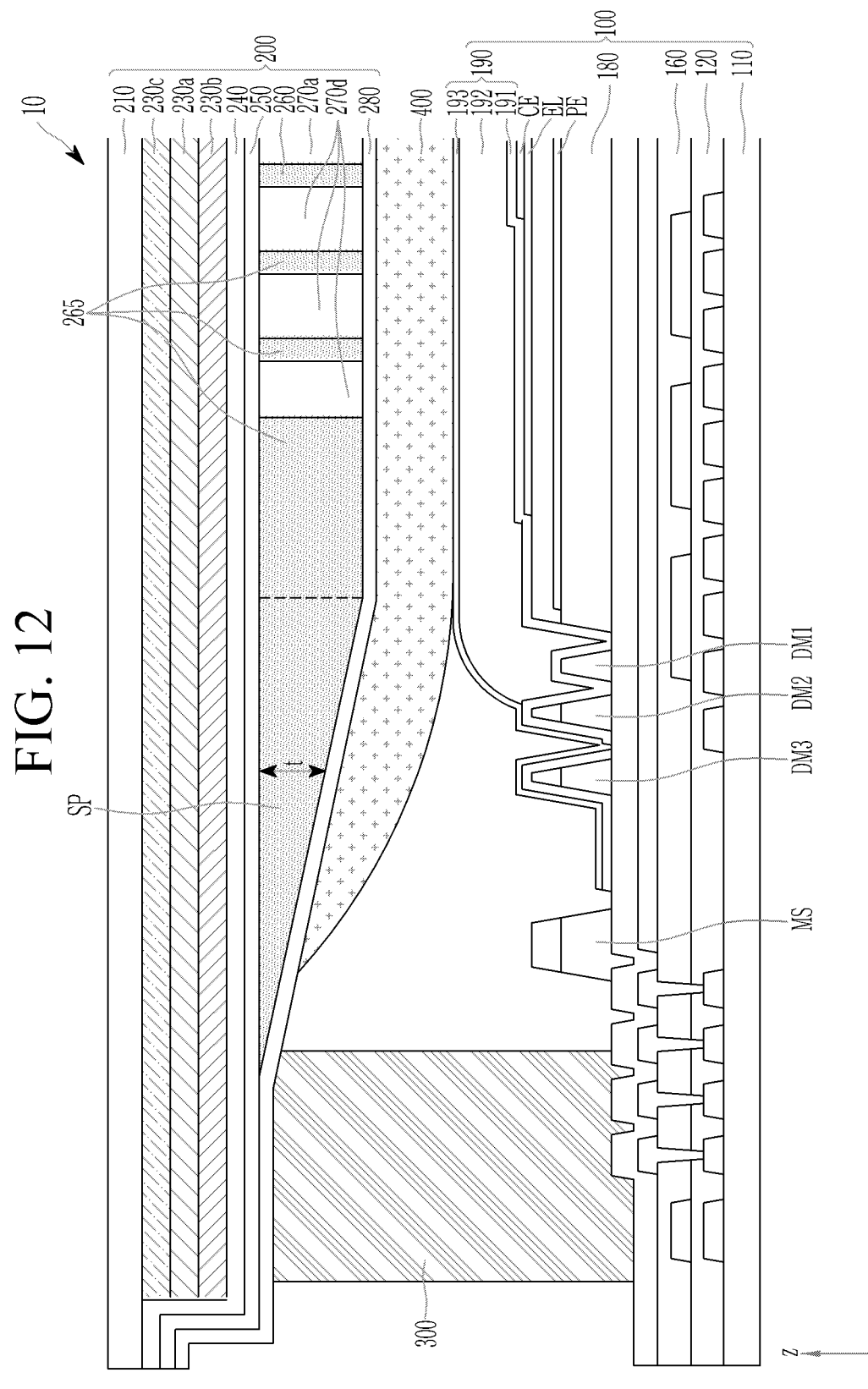

Referring to FIG. 12, an example in which the edge of the pattern SP contacts the sealant 300 is shown. For example, the pattern SP may overlap a portion of the sealant 300 that corresponds to equal to or less than about 30%, equal to or less than about 20%, or equal to or less than about 10% a width of the sealant 300 from the sealant 300. As the sealing material may be pressed and may be spread to the inside and the outside of the display panel 10 in case that the display unit 100 is bonded to the color converting unit 200, the portion spread to the inside of the display panel 10 may overlap the edge of the pattern SP. The thickness of the pattern SP may be reduced and the edge of the pattern SP may be formed to be thin toward the outside of the display panel 10, so in case that the sealing material overlaps the edge of the pattern SP, the influence for the sealing material to be spread to the outside of the display panel 10 may be minimized.

Figure 13:
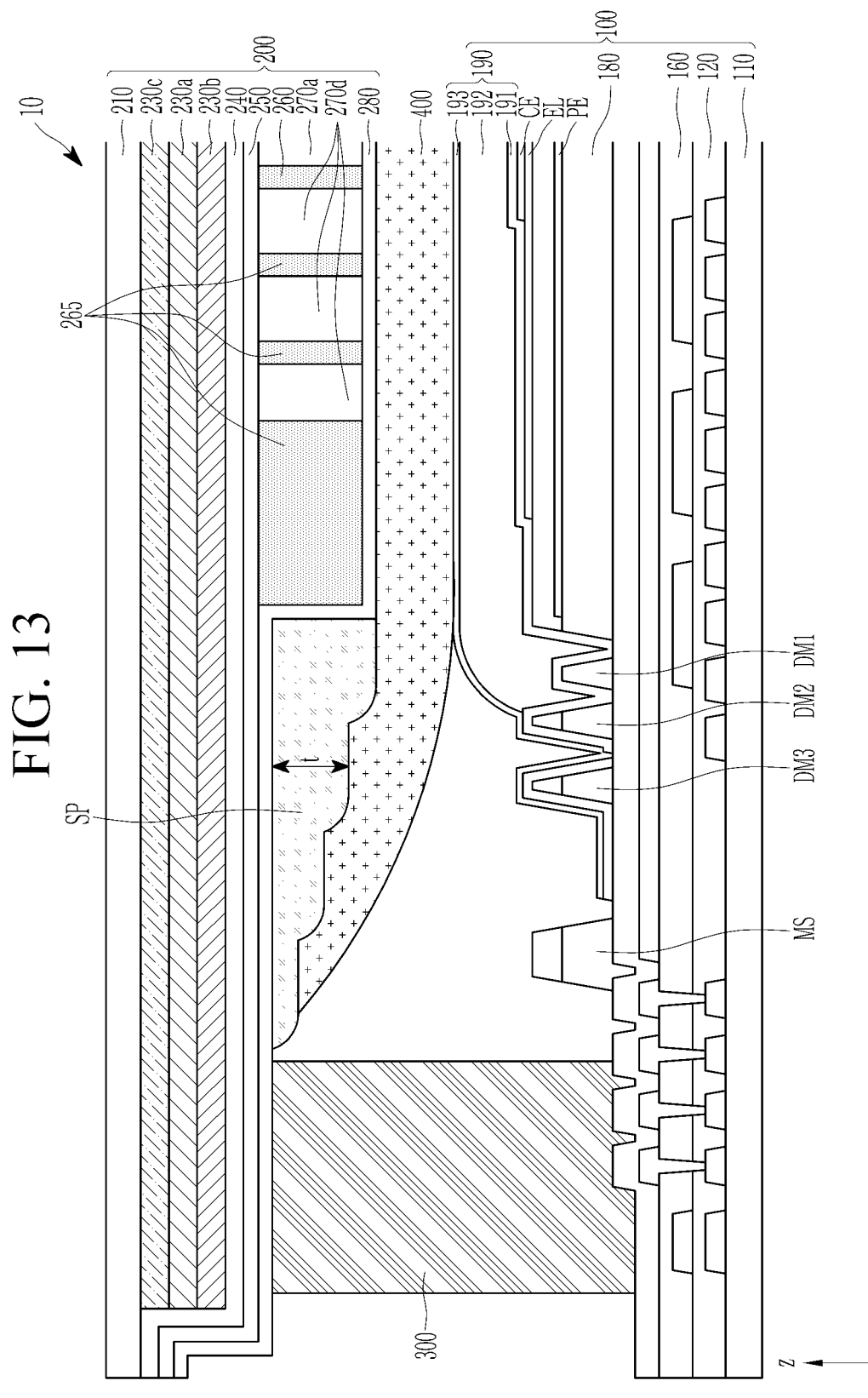

Referring to FIG. 13, an example in which the pattern SP may be formed not between the first capping layer 250 and the second capping layer 280 but on another position is shown. The pattern SP may be positioned between the second capping layer 280 and the filler 400. For example, a second capping layer 280 for covering the bank 260 and the dummy bank 265 may be formed, and the pattern SP may be formed on the second capping layer 280. Hence, the pattern SP may be separated from the dummy bank 265 with the second capping layer 280 therebetween. The pattern SP may be formed in a process that may be different from the process for forming the bank 260 and the dummy bank 265. For example, the pattern SP may be formed by coating a photosensitive organic material on the second capping layer 280 and patterning the same, or may be formed by drawing a material of the pattern SP on the second capping layer 280 in a like way of an inkjet process. The thickness t of the pattern SP may be reduced in a staircase way toward the outside of the display panel 10. The thickness t of the pattern SP may be gradually reduced toward the outside of the display panel 10 in a similar way to what are described with reference to FIG. 9, FIG. 10, FIG. 11, or FIG. 12. The display panel 10 may further include a capping layer (not shown) for covering the pattern SP between the pattern SP and the filler 400.

According to the above-described embodiments, in any case, a portion of the pattern SP provided near the sealant 300 may be very thin so the filler 400 may be further spread to the outside of the display panel 10, substantially giving no influence to the process control condition of the sealant 300, and the color converting unit 200 and the display unit 100 may be supported together with the filler 400. Therefore, in case that the display unit 100 is bonded to the color converting unit 200 and the scribe process is performed, margins may be obtained, and the defects such as light leakage or stains may be prevented from being generated at the border of the display panel 10 by preventing the display unit 100 and the color converting unit 200 from being drooped.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the disclosure.

What is claimed is:

1. A display device defining a thickness direction and comprising:

a display portion;

a color converting portion;

a filler disposed and extending continuously between the display portion and the color converting portion; and a sealant bonding the display portion and the color converting portion, wherein the color converting portion includes:

a substrate;

a bank disposed on the substrate and including an opening;

a color converting layer disposed in the opening of the bank; and a pattern disposed between the bank and the sealant and not overlapping the bank in the thickness direction, a thickness of the pattern is reduced toward an outside of the color converting portion such that the pattern has a first portion having a first height from the substrate in the thickness direction and a second portion having a second height from the substrate in the thickness direction, the first portion being nearer to the sealant than the second portion, the first height is less than the second height, the filler has a curved surface in a portion overlapping the pattern and covers at least a portion the first portion of the pattern, and a gap is defined between the filler and the sealant.

2. The display device of claim 1, wherein the color converting portion further includes a dummy bank disposed between the bank and the pattern, and the pattern is physically connected to the dummy bank.

3. The display device of claim 2, wherein the pattern and the dummy bank are integral with each other.

4. The display device of claim 2, wherein the pattern, the dummy bank, and the bank include a same material.

5. The display device of claim 2, wherein the color converting portion includes a display area for displaying images and a non-display area surrounding the display area, the bank is disposed in the display area, and the pattern, the dummy bank, and the sealant are disposed in the non-display area.

6. The display device of claim 1, wherein the color converting portion further includes:

a color filter disposed on the substrate;

a first capping layer disposed on the color filter; and a second capping layer disposed on the color converting layer, and the bank and the pattern are disposed between the first capping layer and the second capping layer.

7. The display device of claim 6, wherein each of the bank and the pattern includes a first side contacting the first capping layer and a second side contacting the second capping layer.

8. The display device of claim 1, wherein the display portion includes:

a display substrate;

a light emitting diode disposed on the display substrate; and an encapsulation layer disposed on the light emitting diode, and the filler contacts the encapsulation layer.

9. The display device of claim 8, wherein the display portion includes a display area for displaying images, and a non-display area surrounding the display area, the display portion further includes a dam disposed in the non-display area and surrounding the display area, and a mask support disposed in the non-display area and spaced from the dam, and the filler overlaps the mask support.

10. The display device of claim 9, wherein the color converting layer includes quantum dots and overlaps the light emitting diode.

11. The display device of claim 1, wherein the thickness of the pattern is reduced in a staircase structure toward the outside of the color converting portion.

12. The display device of claim 1, wherein a slope for the thickness of the pattern to be reduced is constant, is gradually increased, or is gradually reduced toward the outside of the color converting portion.

13. The display device of claim 1, wherein the pattern includes a portion overlapping the sealant.

14. The display device of claim 1, wherein the pattern has a stepped configuration comprising at least three flat surfaces orthogonal to a thickness direction of the display devices offset from each other in the thickness direction.

15. A display device comprising:

a display portion in which light emitting diodes are disposed on a first substrate;

a color converting portion overlapping the display portion, in which color converting layers including quantum dots are disposed on a second substrate;

a filler disposed and extending continuously between the display portion and the color converting portion; and a sealant bonding the display portion and the color converting portion, wherein the display portion and the color converting portion include a display area for displaying images and a non-display area adjacent to the display area, the color converting portion includes:

a bank disposed in the display area and partitioning the color converting layers;

a dummy bank disposed in the non-display area and including a same material as the bank; and a pattern disposed between the dummy bank and the sealant and not overlapping the dummy bank in the non-display area, and including a same material as the bank, a thickness of a first portion of the pattern adjacent to the sealant is less than a thickness of a second portion of the pattern adjacent to the dummy bank, the first portion being nearer to the sealant than the second portion, the filler has a curved surface in a portion overlapping the pattern and covers at least a portion of the first portion of the pattern, and a gap is defined between the filler and the sealant.

16. The display device of claim 15, wherein the thickness of the pattern is gradually reduced toward the first portion from the second portion.

17. The display device of claim 15, wherein the pattern and the dummy bank are integral with each other.

18. The display device of claim 15, wherein the color converting portion further includes:

a color filter disposed on the second substrate;

a first capping layer disposed on the color filter; and a second capping layer disposed on the color converting layers, and the bank, the dummy bank, and the pattern are disposed between the first capping layer and the second capping layer.

19. The display device of claim 15, wherein the filler covers the bank and the dummy bank.

20. The display device of claim 19, wherein the display portion further includes an encapsulation layer disposed on the light emitting diodes and including an inorganic layer and an organic layer, and the filler contacts the encapsulation layer.

* * * * *